(12) United States Patent
Harada et al.

(10) Patent No.: US 11,495,678 B2
(45) Date of Patent: Nov. 8, 2022

(54) SEMICONDUCTOR DEVICE

(71) Applicant: Mitsubishi Electric Corporation, Tokyo (JP)

(72) Inventors: Kenji Harada, Tokyo (JP); Kakeru Otsuka, Tokyo (JP); Hirofumi Oki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/318,894

(22) Filed: May 12, 2021

(65) Prior Publication Data
US 2022/0037514 A1     Feb. 3, 2022

(30) Foreign Application Priority Data
Jul. 29, 2020 (JP) .............................. JP2020-128634

(51) Int. Cl.
*H01L 29/739* (2006.01)
*H01L 29/10* (2006.01)
*H01L 29/861* (2006.01)

(52) U.S. Cl.
CPC ...... *H01L 29/7397* (2013.01); *H01L 29/1095* (2013.01); *H01L 29/861* (2013.01)

(58) Field of Classification Search
CPC   H01L 29/7397; H01L 29/1095; H01L 29/861
USPC ......................................................... 257/140
See application file for complete search history.

(56) References Cited

U.S. PATENT DOCUMENTS

| 9,472,548 B2 | 10/2016 | Soneda | |
|---|---|---|---|
| 2012/0043581 A1* | 2/2012 | Koyama | ............. H01L 29/8613 257/140 |
| 2014/0048847 A1 | 2/2014 | Yamashita et al. | |
| 2017/0098700 A1 | 4/2017 | Yamashita et al. | |

(Continued)

FOREIGN PATENT DOCUMENTS

| DE | 112012003111 T5 | 4/2014 |
|---|---|---|
| JP | 2017-98359 A | 6/2017 |
| JP | 6319057 B2 | 5/2018 |

OTHER PUBLICATIONS

Lutz, J. et al., "Semiconductor Power Devices", Heidelberg, Springer, 2011, pp. 331-332, ISBN 978-3-642-11124-2.

(Continued)

*Primary Examiner* — Igwe U Anya
(74) *Attorney, Agent, or Firm* — Studebaker & Brackett PC

(57) ABSTRACT

A semiconductor device includes a semiconductor substrate, a transistor region, a diode region, a boundary trench gate, and a carrier control region. The boundary trench gate is provided in a boundary portion between the transistor region and the diode region. The carrier control region is provided as a surface layer of the semiconductor substrate at a position closer to the boundary trench gate than the source layer located between the boundary trench gate and the trench gate. A concentration of first conductivity type impurities contained in the carrier control region is higher than a concentration of the first conductivity type impurities contained in the source layer or a concentration of second conductivity type impurities contained in the carrier control region is lower than a concentration of the second conductivity type impurities contained in the source layer.

8 Claims, 27 Drawing Sheets

E-E CROSS-SECTION

(56) References Cited

U.S. PATENT DOCUMENTS

2018/0374947 A1   12/2018  Yamashita et al.
2020/0388608 A1*  12/2020  Takano ........... H01L 21/823418
2021/0265491 A1*   8/2021  Soneda ............... H01L 29/0696

OTHER PUBLICATIONS

An Office Action issued by the German Patent and Trade Mark Office dated Aug. 9, 2022, which corresponds to German Patent Application No. 102021117405.8 and is related to U.S. Appl. No. 17/318,894; with English language translation.

* cited by examiner

F I G. 5
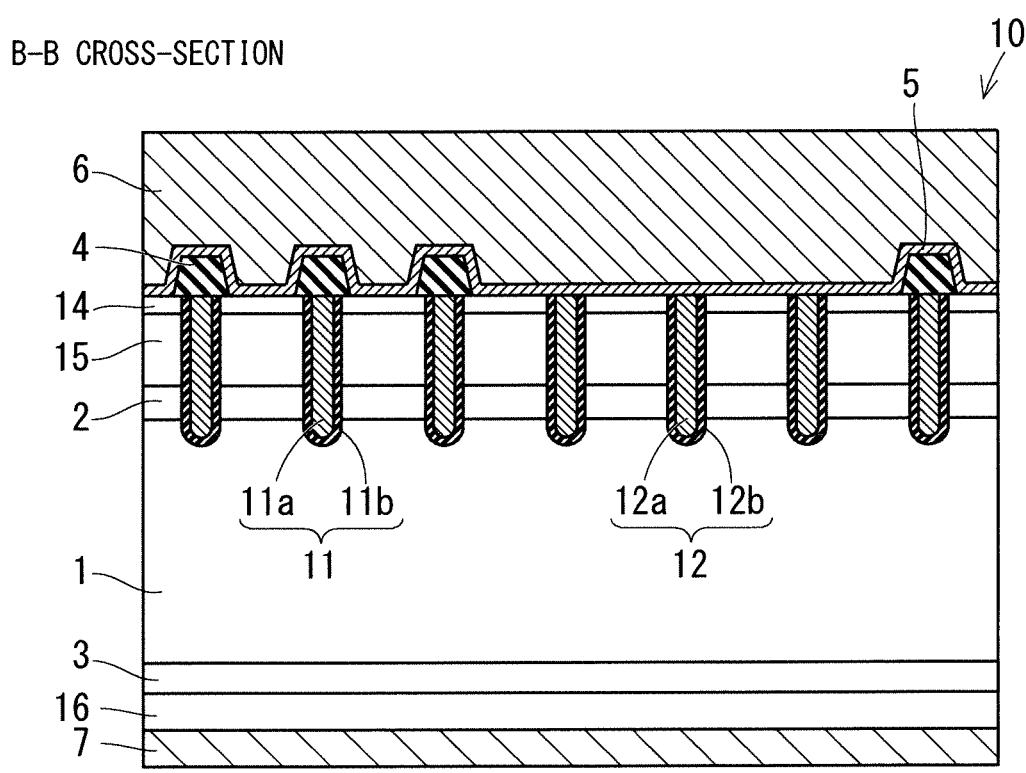

E-E CROSS-SECTION

F I G. 1 4
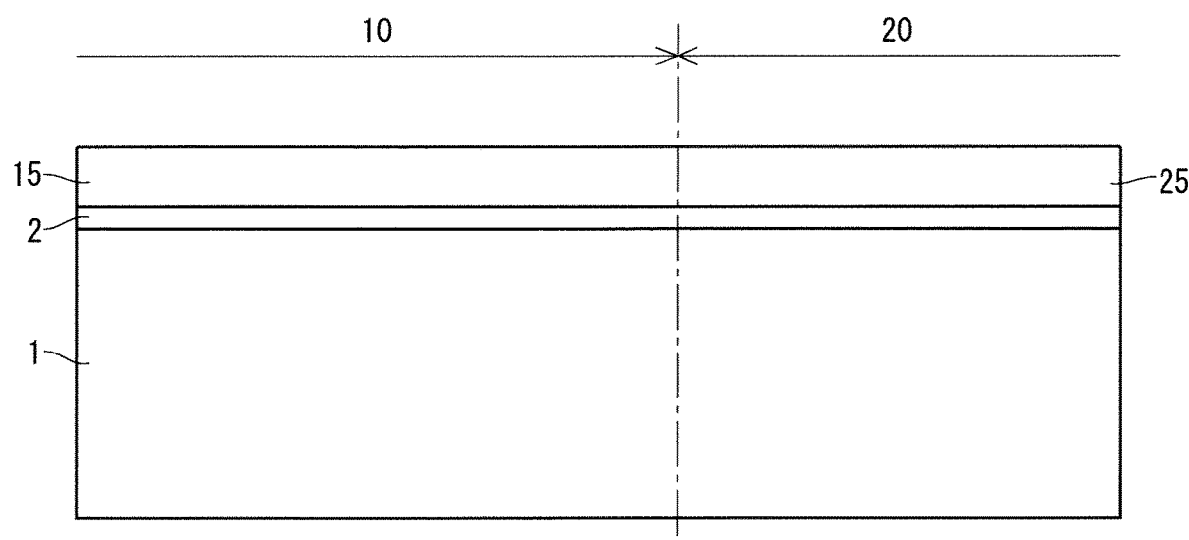

F I G. 1 6
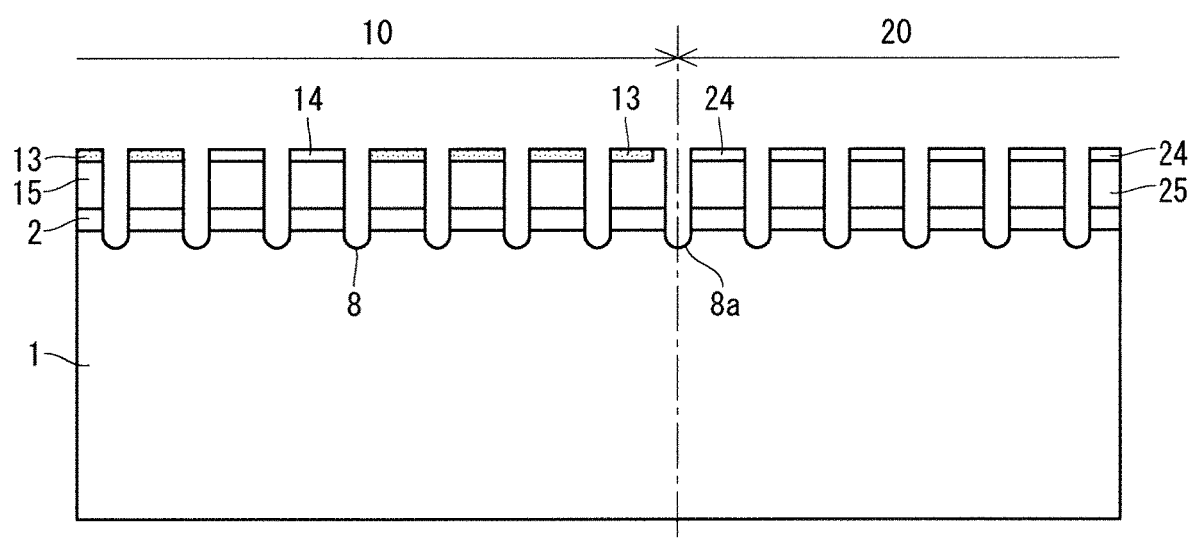

F I G. 1 7
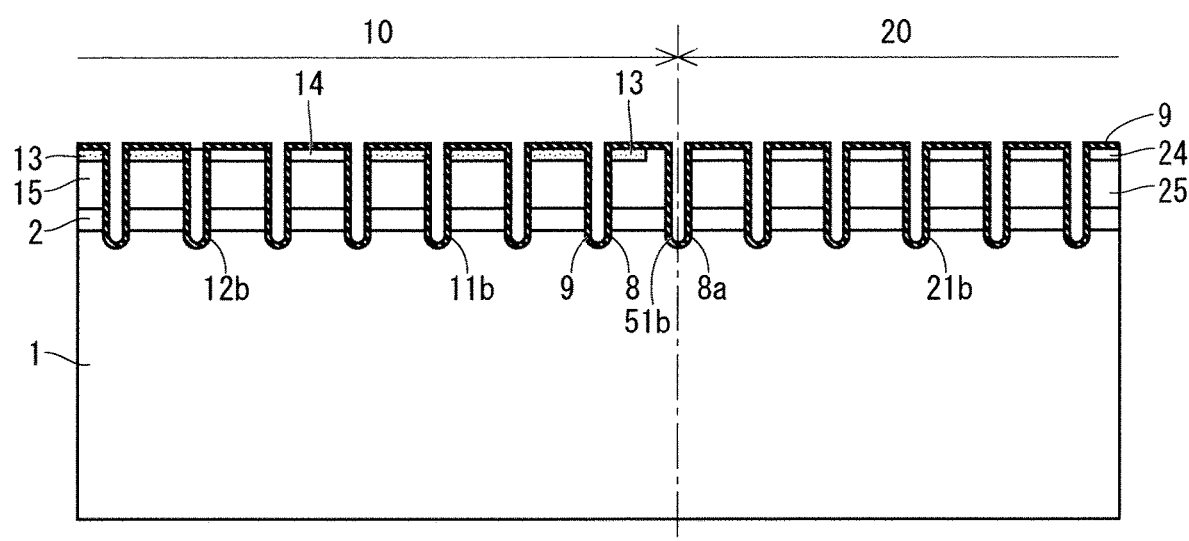

F I G. 1 8
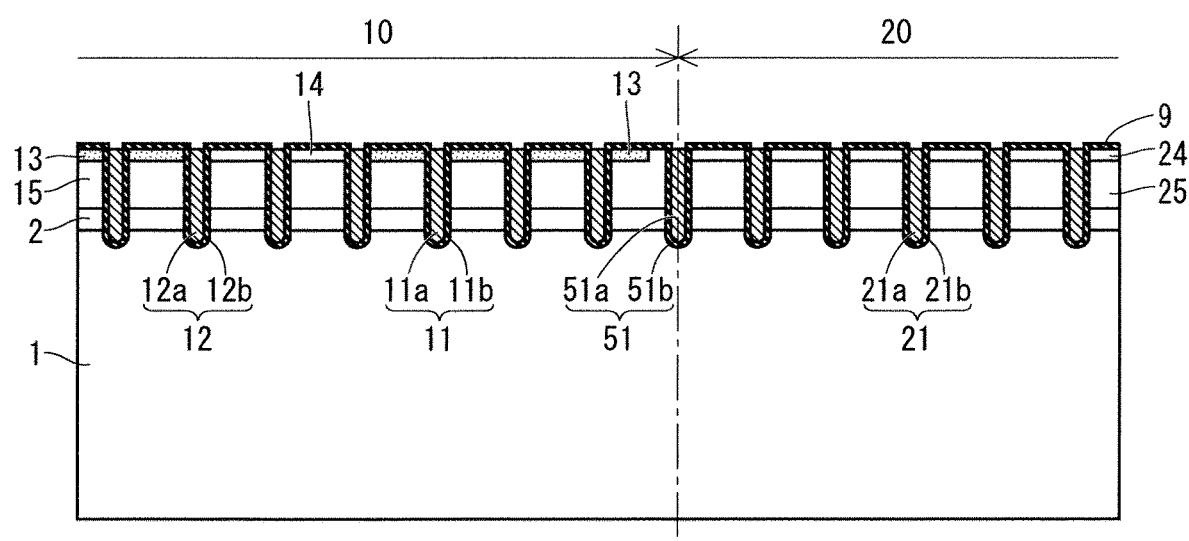

F I G. 2 1
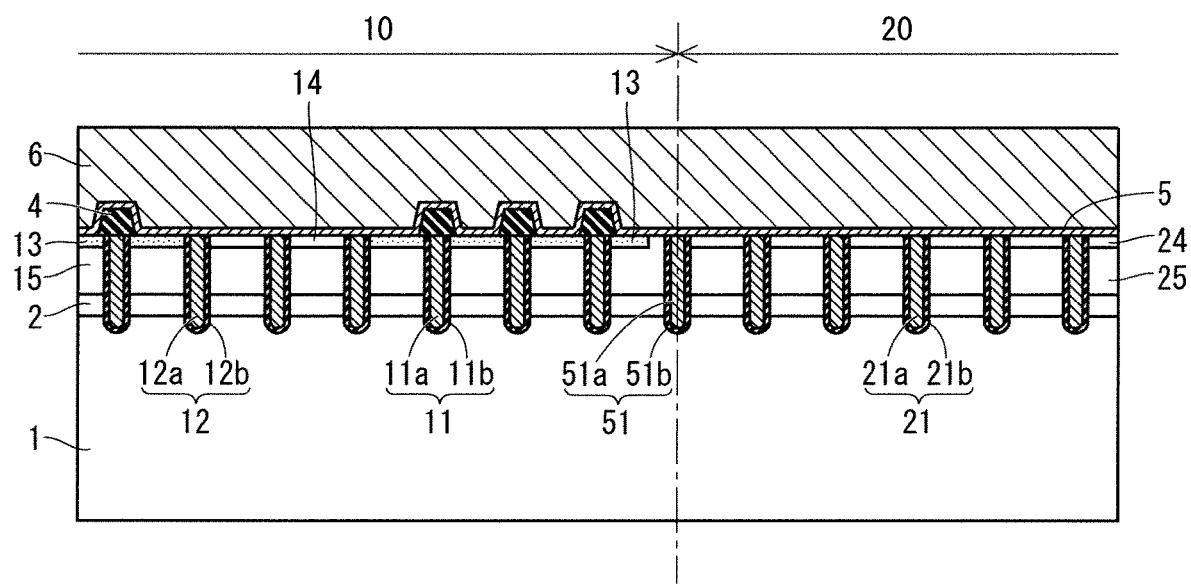

F I G. 2 2
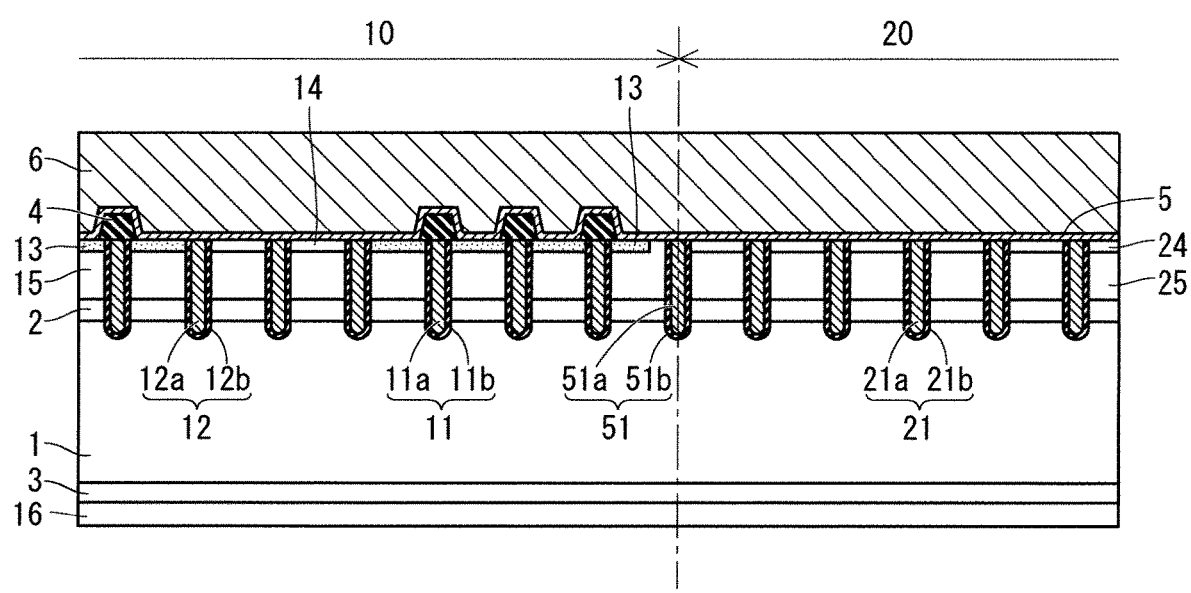

F I G. 2 3
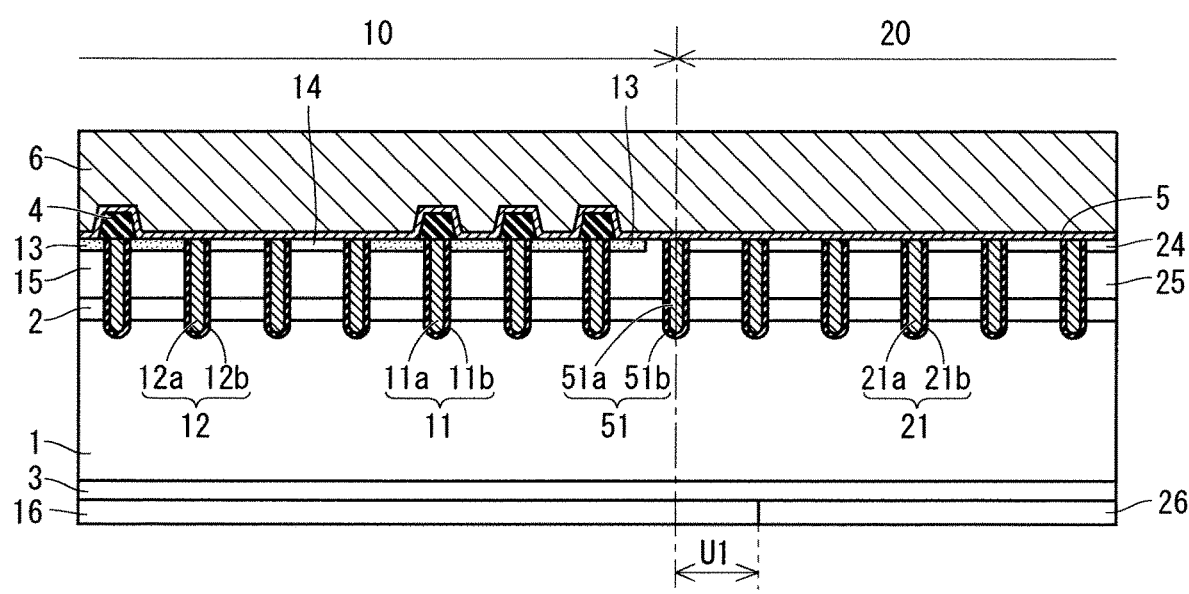

F I G. 2 5
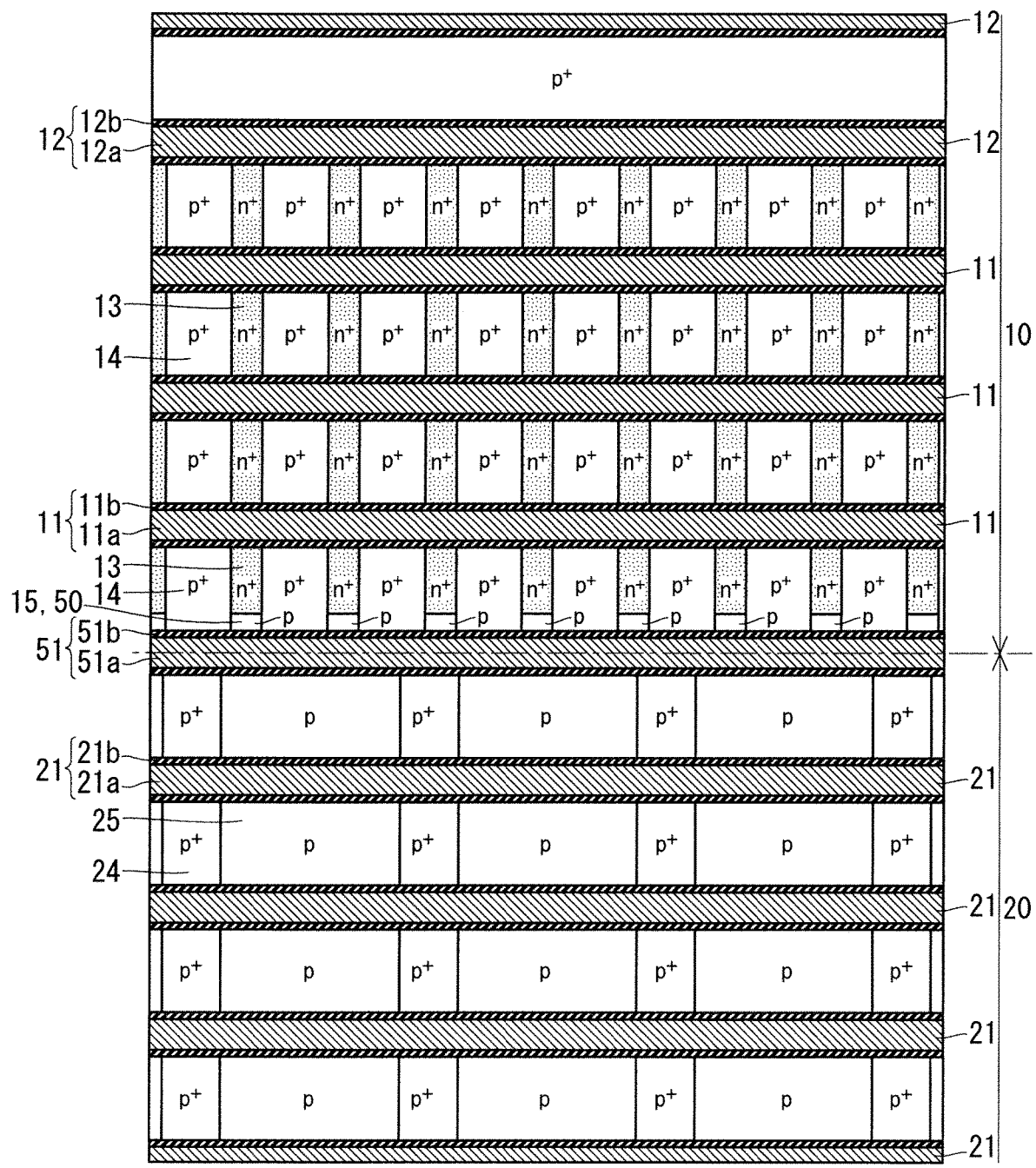

E-E CROSS-SECTION

SEMICONDUCTOR DEVICE

BACKGROUND OF THE INVENTION

Field of the Invention

The present disclosure relates to a semiconductor device.

Description of the Background Art

Reverse Conducting Insulated Gate Bipolar Transistors (RC-IGBTs) have been developed to improve performance and reduce cost of semiconductor devices. An RC-IGBT has an IGBT and a diode built in a same semiconductor substrate. That is, the RC-IGBT is a semiconductor device in which functions of the IGBT and the diode are integrated into one chip. A transistor region including an IGBT cell structure and a diode region including a diode cell structure are arranged within a plane of the semiconductor substrate constituting the RC-IGBT. A structure of a boundary portion between the transistor region and the diode region affects electrical characteristics of the RC-IGBT.

See, for example, Japanese Patent No. 639057.

Since a $p^+$ type contact layer in the transistor region has lower resistance than a p type anode layer in the diode region, holes (carriers) easily flow from the diode region to the transistor region when operation of the diode is switched from on to off. Therefore, holes are concentrated at the boundary portion between the diode region and the transistor region, and a large current is more likely to flow near the boundary than at other locations. The current concentration may cause element destruction.

SUMMARY

In order to solve the above problems, the present disclosure provides a semiconductor device that reduces element destruction caused by a current concentrated at a boundary portion between a transistor region and a diode region.

The semiconductor device according to the present disclosure includes a semiconductor substrate, a transistor region, a diode region, a boundary trench gate, and a carrier control region. A transistor is formed in the transistor region. The transistor includes a first conductivity type base layer, a second conductivity type source layer, and a trench gate. The first conductivity type base layer is provided in a surface layer of the semiconductor substrate. The second conductivity type source layer is selectively provided in a surface layer of the base layer. The trench gate extends so as to cross the source layer in plan view. A diode is formed in the diode region. The diode region is disposed adjacent to the transistor region. The boundary trench gate is provided in a boundary portion between the transistor region and the diode region. The carrier control region is provided as the surface layer of the semiconductor substrate at a position closer to the boundary trench gate than the source layer located between the boundary trench gate and the trench gate. A concentration of first conductivity type impurities contained in the carrier control region is higher than a concentration of the first conductivity type impurities contained in the source layer or a concentration of second conductivity type impurities contained in the carrier control region is lower than a concentration of the second conductivity type impurities contained in the source layer.

The semiconductor device of the present disclosure reduces element destruction caused by a current concentrated at a boundary portion between a transistor region and a diode region.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 5 is a cross-sectional view illustrating a configuration of the IGBT region of the semiconductor device according to the first preferred embodiment;

FIG. 14 is a diagram illustrating a step of forming an n type carrier storage layer, a p type base layer, and a p type anode layer;

FIG. 16 is a diagram illustrating a step of forming trenches;

FIG. 17 is a diagram illustrating a step of forming an oxide film;

FIG. 18 is a diagram illustrating a step of forming a gate trench electrode, a dummy trench electrode, a diode trench electrode, and a boundary trench electrode;

FIG. 21 is a diagram illustrating a step of thinning the semiconductor substrate;

FIG. 22 is a diagram illustrating a step of forming an n type buffer layer and a p type collector layer;

FIG. 23 is a diagram illustrating a step of forming an n⁺ type cathode layer;

FIG. 25 is a plan view illustrating a configuration of a boundary portion between an IGBT region and a diode region in the second preferred embodiment;

DESCRIPTION OF THE PREFERRED EMBODIMENTS

First Preferred Embodiment

A semiconductor device and a method for manufacturing the semiconductor device according to the first preferred embodiment will be described below. In the following description, n and p indicate conductivity types of a semiconductor. n⁻ indicates that an impurity concentration is lower than n. n⁺ indicates that an impurity concentration is higher than n. Similarly, p⁻ indicates that an impurity concentration is lower than p. p⁺ indicates that an impurity concentration is higher than p. The p type and n type of each layer described below may be interchanged with each other.

(Overall structure of semiconductor device)

Figure 1:
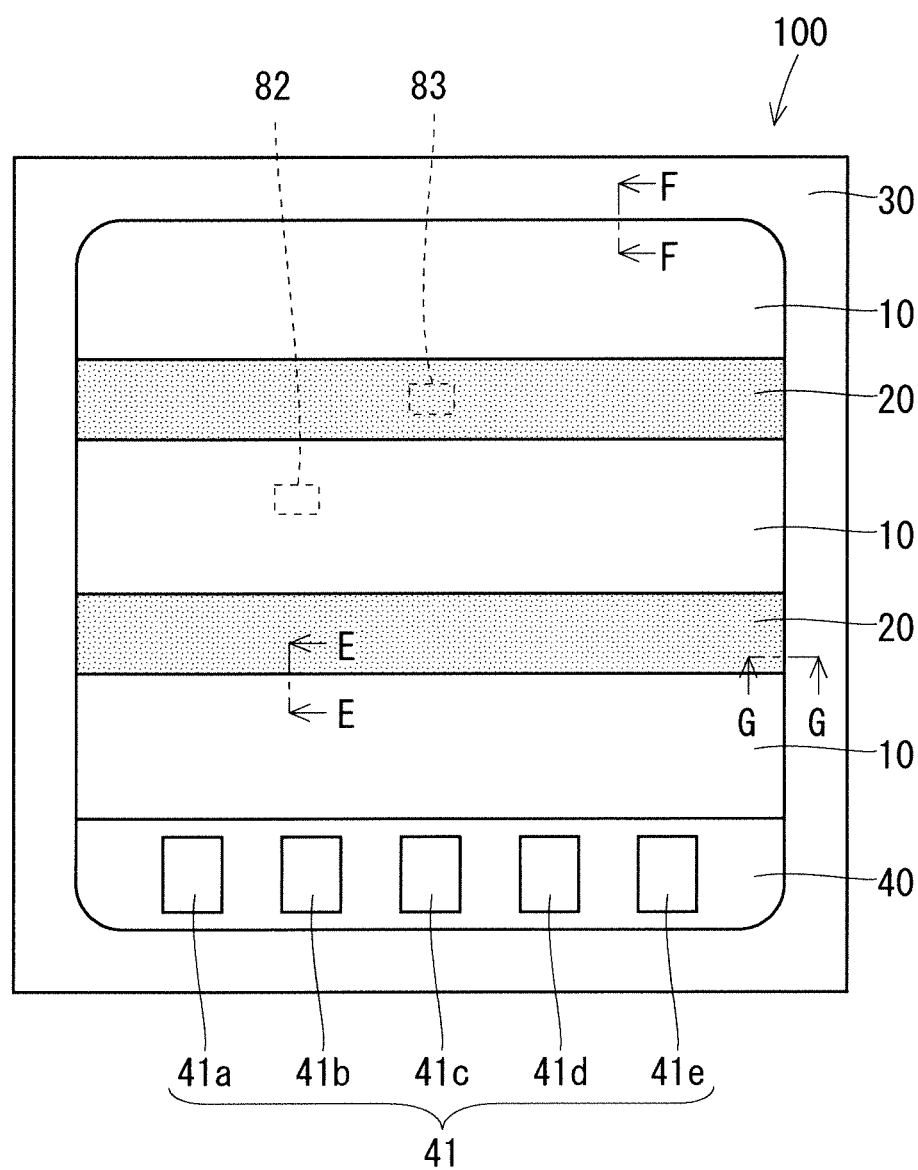
FIG. 1 is a plan view illustrating an example of a configuration of a semiconductor device according to a first preferred embodiment.

FIG. 1 is a plan view illustrating an example of a configuration of a semiconductor device 100 according to the first preferred embodiment. The semiconductor device 100 has an Insulated Gate Bipolar Transistor (IGBT) region 10 and a diode region 20 in one semiconductor substrate. The diode region 20 is adjacent to the IGBT region 10. A plurality of IGBT cell structures (IGBT cells) are formed in the IGBT region 10, and a plurality of freewheeling diode cell structures (diode cells) are formed in the diode region 20. A cell structure is a structure corresponding to a smallest unit of an element. A region including the IGBT region 10 and the diode region 20 is referred to as a cell region. The semiconductor device 100 according to the first preferred embodiment is a Reverse Conducting IGBT (RC-IGBT). The semiconductor substrate is formed of, for example, a semiconductor such as Si or a so-called wide band gap semiconductor such as SiC or GaN.

The IGBT region 10 and the diode region 20 have a striped planar shape. The IGBT region 10 and the diode region 20 extend in one direction within a plane of the semiconductor substrate. The IGBT region 10 and the diode region 20 are provided alternately side by side in a direction orthogonal to the direction in which the IGBT region 10 and the diode region 20 extend. Such a semiconductor device 100 is called a "striped type".

Figure 2:
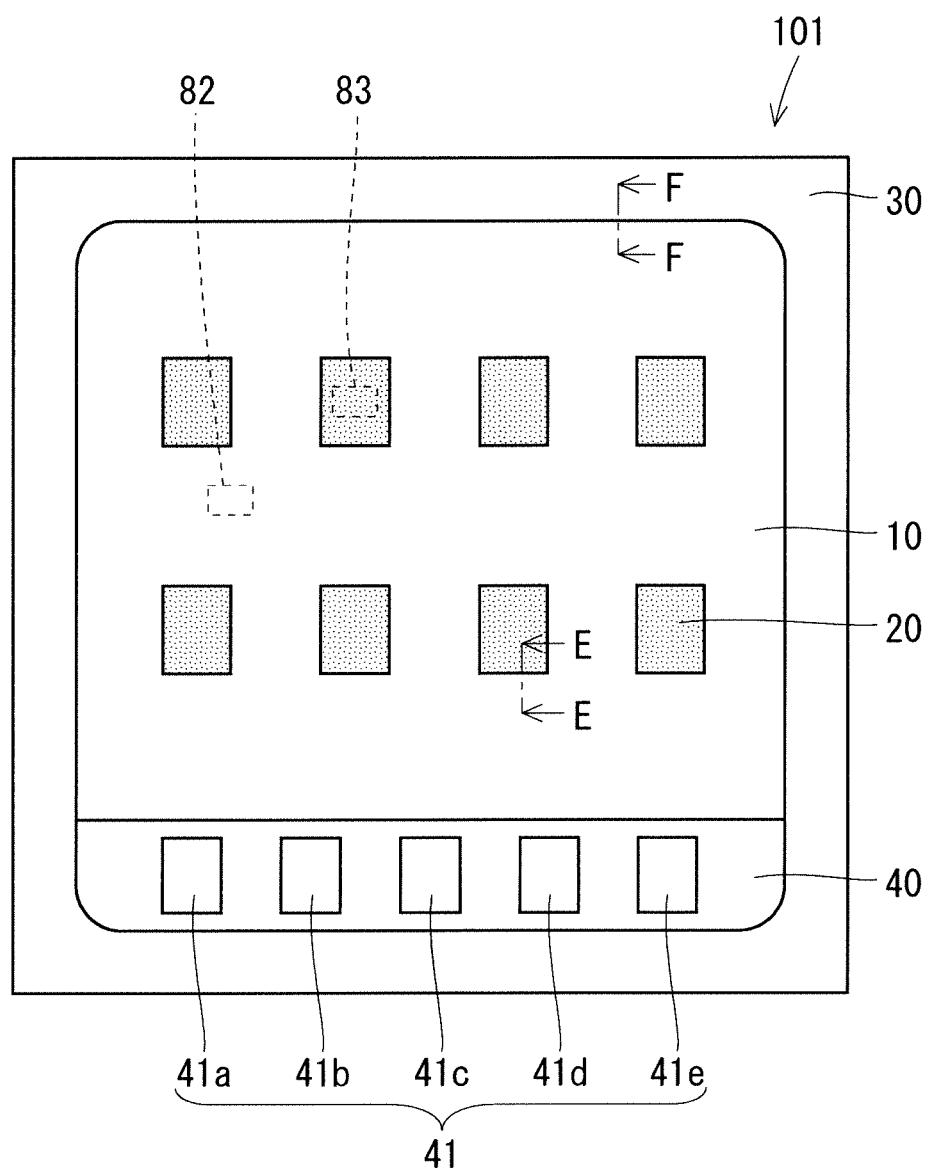
FIG. 2 is a plan view illustrating an example of a configuration of the semiconductor device according to the first preferred embodiment.

FIG. 2 is a plan view illustrating an example of a configuration of a semiconductor device 101 according to the first preferred embodiment. Similar to the semiconductor device 100, the semiconductor device 101 is also an RC-IGBT having an IGBT region 10 and a diode region 20 in one semiconductor substrate.

The diode region 20 has an island-shaped planar shape. In this example, a plurality of diode regions 20 are arranged side by side in a longitudinal direction and a lateral direction within a plane of the semiconductor substrate. The IGBT region 10 surrounds each of the plurality of diode regions 20. Such a semiconductor device 101 is referred to as an "island type".

Each of the semiconductor devices 100 and 101 includes a pad region 40 and a terminal region 30 in addition to the IGBT region 10 and the diode region 20.

The pad region 40 is provided outside the cell region, that is, outside the IGBT region 10 and the diode region 20. In this example, the pad region 40 is provided adjacent to the IGBT region 10. The pad region 40 is a region in which control pads 41 for controlling the semiconductor device are provided. The control pads 41 include, for example, a current sense pad 41a, a Kelvin emitter pad 41b, a gate pad 41c, temperature sense diode pads 41d and 41e, and the like.

The current sense pad 41a is a control pad for detecting a current flowing through the cell region. The current sense pad 41a is electrically connected to one or some IGBT cells or diode cells in the cell region so that a current that is several times or several tens of thousands times smaller than a current flowing through the entire cell region flows.

The Kelvin emitter pad 41b and the gate pad 41c are control pads to which a gate drive voltage for on/off control of the semiconductor device is applied. The Kelvin emitter pad 41b is electrically connected to a p type base layer and an n⁺ type source layer (not illustrated) of the IGBT cell. The Kelvin emitter pad 41b and the p type base layer may be electrically connected via a p⁺ type contact layer (not illustrated). The gate pad 41c is electrically connected to a gate trench electrode (not illustrated) of the IGBT cell.

The temperature sense diode pads 41d and 41e are control pads electrically connected to an anode and a cathode of a temperature sense diode (not illustrated) provided in the cell region. The temperature sense diode pads 41d and 41e measure a voltage between the anode and the cathode of the temperature sense diode to measure a temperature of the semiconductor device.

The terminal region 30 is provided so as to surround a region combining the cell region and the pad region 40. The terminal region 30 has a structure for holding a withstand voltage of the semiconductor device. Any of various structures is appropriately selected as the withstand voltage holding structure. The withstand voltage holding structure is, for example, Field Limiting Ring (FLR), Variation of Lateral Doping (VLD), or the like formed in a surface layer on a first main surface side (an upper surface side) of the semiconductor device. The FLR has a p type terminal well layer (not illustrated) provided so as to surround the cell region. The VLD has a p type well layer (not illustrated) that is provided so as to surround the cell region and has a concentration gradient in an in-plane direction of the semiconductor substrate. The number of ring-shaped p type terminal well layers 31 constituting the FLR and a concentration distribution of the p type well layers constituting the VLD are appropriately selected depending on withstand voltage design of the semiconductor device. Further, a p type end well layer may be provided over almost entire pad region 40. Alternatively, an IGBT cell or a diode cell may be provided in the pad region 40.

In FIG. 1, three IGBT regions 10 and two diode regions 20 are illustrated. However, the number of IGBT regions 10 and the number of diode regions 20 are not limited to those illustrated in FIG. 1. The number of IGBT regions 10 may be four or more or may be two or less. The number of diode regions 20 may be three or more or may be one. Each diode region 20 illustrated in FIG. 1 is sandwiched between two IGBT regions 10. However, the arrangement of the IGBT regions 10 and the diode regions 20 is not limited thereto.

The semiconductor device 100 may be configured such that the positions of the IGBT regions 10 and the diode regions 20 are reverse to those illustrated in FIG. 1. That is, each IGBT region 10 may be sandwiched between two diode regions 20. Alternatively, equal number of IGBT regions 10 and diode regions 20 may be provided so that the IGBT region 10 and the diode region 20 are alternated.

In FIG. 2, a plurality of diode regions 20 are arranged in a matrix in four columns in the left-right direction and two rows in the up-down direction. However, the number and the arrangement of the diode regions 20 are not limited thereto. The semiconductor device 101 may be configured such that at least one diode region 20 is scattered in the IGBT region 10. The diode region 20 may be arranged in any way as long as the diode region 20 is surrounded by the IGBT region 10.

(Structure of IGBT Region)

Figure 3:
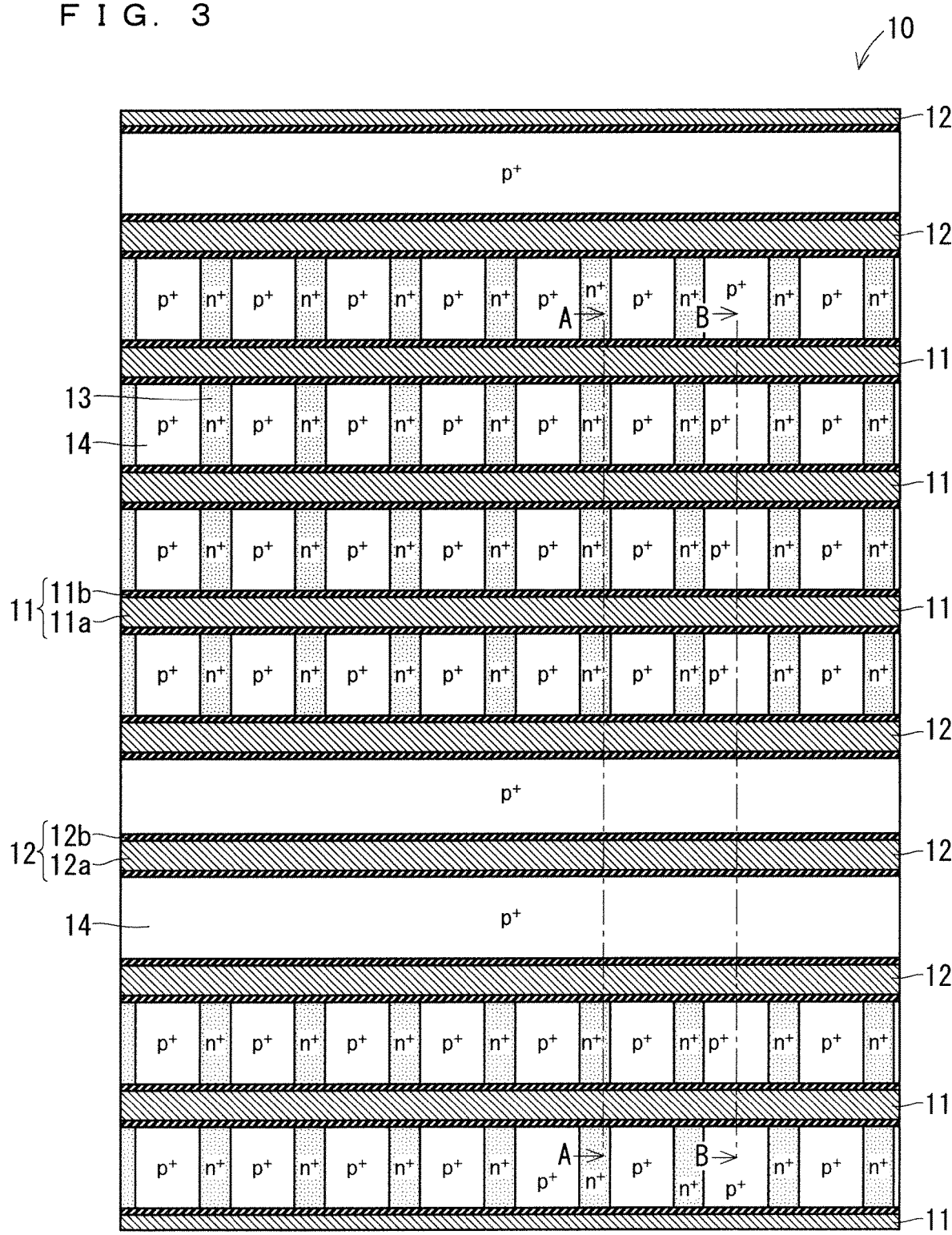
FIG. 3 is a partially enlarged plan view illustrating a configuration of an IGBT region of the semiconductor device according to the first preferred embodiment.

FIG. 3 is a partially enlarged plan view illustrating a configuration of the IGBT region 10 of the semiconductor device according to the first preferred embodiment. FIG. 3 is an enlarged view of a region 82 in the semiconductor device 100 illustrated in FIG. 1 or the semiconductor device 101 illustrated in FIG. 2.

The semiconductor device 100 and the semiconductor device 101 each include an active trench gate 11 and a dummy trench gate 12 provided in the IGBT region 10.

In the semiconductor device 100, the active trench gate 11 and the dummy trench gate 12 extend in the longitudinal direction of the IGBT region 10. In other words, the active trench gate 11 and the dummy trench gate 12 in the semiconductor device 100 have longer sides in the direction in which the IGBT region 10 extends. The longitudinal direction of the IGBT region 10 corresponds to the left-right direction in FIG. 3.

In the semiconductor device 101, the active trench gate 11 and the dummy trench gate 12 extend in one direction in the IGBT region 10. For example, the active trench gate 11 and the dummy trench gate 12 extend in either the up-down direction or the left-right direction in FIG. 2.

The active trench gate 11 includes a gate trench insulating film 11b and a gate trench electrode 11a. Although details of a cross-sectional structure of the active trench gate 11 will be described later, the gate trench insulating film 11b is formed along an inner wall of a trench formed in the depth direction from the first main surface (the upper surface) of the semiconductor substrate. The gate trench electrode 11a is formed inside the trench with the gate trench insulating film 11b interposed therebetween. The gate trench electrode 11a is electrically connected to the gate pad 41c (not illustrated).

The dummy trench gate 12 includes a dummy trench insulating film 12b and a dummy trench electrode 12a. Although details of a cross-sectional structure of the dummy trench gate 12 will be described later, the dummy trench insulating film 12b is formed along an inner wall of a trench formed in the depth direction from the first main surface of the semiconductor substrate. The dummy trench electrode 12a is formed inside the trench with the dummy trench insulating film 12b interposed therebetween. The dummy trench electrode 12a is electrically connected to an emitter electrode 6 (see FIG. 4) provided above the first main surface of the semiconductor device 100 or the semiconductor device 101.

An $n^+$ type source layer 13 and a $p^+$ type contact layer 14 are selectively provided in a surface layer on the first main surface side of the semiconductor substrate on which the active trench gate 11 is provided. In the first preferred embodiment, the $n^+$ type source layer 13 and the $p^+$ type contact layer 14 are alternately provided along the direction (the longitudinal direction) in which the active trench gate 11 extends. The active trench gate 11 is provided so as to cross the $n^+$ type source layer 13 and the $p^+$ type contact layer 14. On both sides of the active trench gate 11 (in a direction orthogonal to the extension direction of the active trench gate 11), the $n^+$ type source layer 13 is in contact with the gate trench insulating film 11b. Details of the $n^+$ type source layer 13 and the $p^+$ type contact layer 14 will be described later.

A $p^+$ type contact layer 14 is provided in a surface layer on the first main surface side of the semiconductor substrate on which the dummy trench gate 12 is provided. The $p^+$ type contact layer 14 is provided between two dummy trench gates 12 adjacent to each other.

In FIG. 3, three dummy trench gates 12 are disposed adjacent to three active trench gates 11. Further, another three active trench gates 11 are disposed adjacent to those three dummy trench gates 12. That is, an active trench gate group of three active trench gates 11 and a dummy trench gate group of three dummy trench gates 12 are alternately arranged. The number of active trench gates 11 included in one active trench gate group is not limited to three and may be one or more. Further, the number of dummy trench gates 12 included in one dummy trench gate group is not limited to three and may be one or more. However, in the semiconductor device 100 and the semiconductor device 101, the dummy trench gate 12 is not always necessary. That is, all trench gates provided in the IGBT region 10 may be the active trench gate 11.

Figure 4:
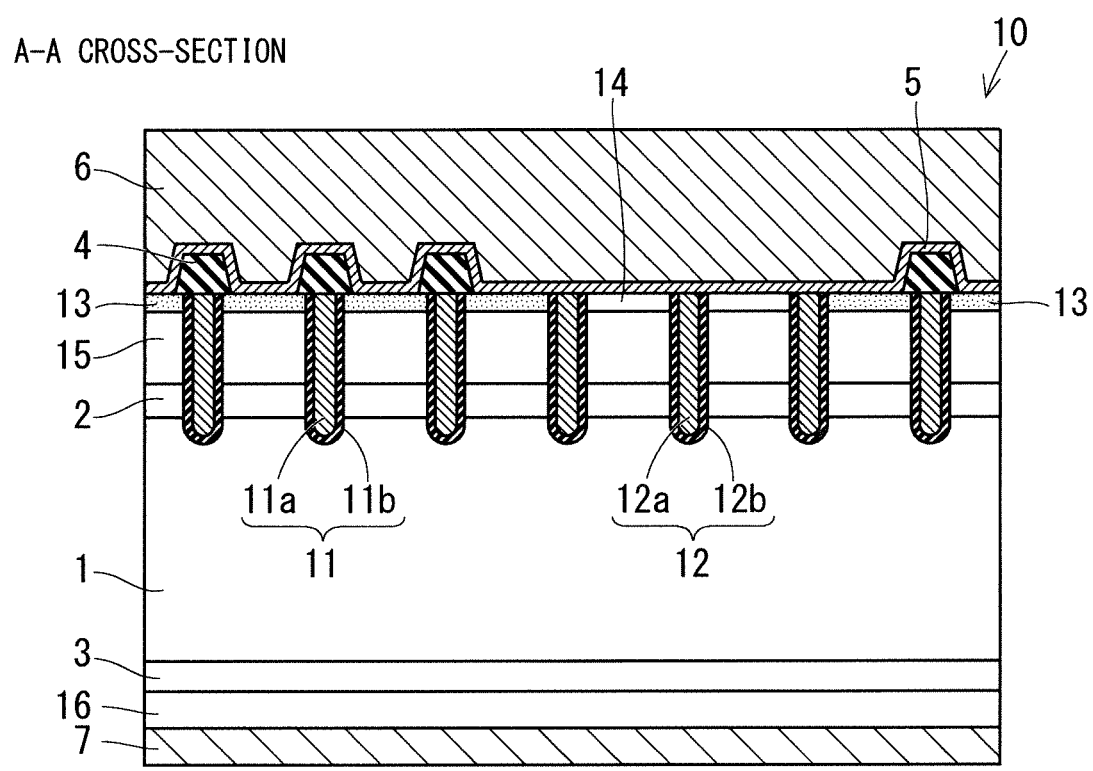
FIG. 4 is a cross-sectional view illustrating a configuration of the IGBT region of the semiconductor device according to the first preferred embodiment.

FIG. 4 is a cross-sectional view illustrating a configuration of the IGBT region 10 of the semiconductor device according to the first preferred embodiment. FIG. 4 illustrates a cross section taken along line A-A shown in FIG. 3.

The semiconductor device 100 and the semiconductor device 101 include, in the IGBT region 10, an $n^-$ type drift layer 1, an n type carrier storage layer 2, a p type base layer 15, the $n^+$ type source layer 13, the $p^+$ type contact layer 14, an n type buffer layer 3, a p type collector layer 16, an interlayer insulating film 4, a barrier metal 5, an emitter electrode 6, and a collector electrode 7. The IGBT cell corresponds to, for example, a region partitioned for each active trench gate 11. Therefore, one IGBT cell has the $n^-$ type drift layer 1, the n type carrier storage layer 2, the p type base layer 15, the $n^+$ type source layer 13, the n type buffer layer 3, the p type collector layer 16, the interlayer insulating film 4, the barrier metal 5, the emitter electrode 6, and the collector electrode 7.

The $n^-$ type drift layer 1 is formed as an inner layer of the semiconductor substrate. The $n^-$ type drift layer 1 is provided between the first main surface and a second main surface of the semiconductor substrate. The first main surface is the upper surface of the semiconductor substrate. The second main surface is a lower surface of the semiconductor substrate that is opposed to the first main surface. The first main surface in the IGBT region 10 corresponds to surfaces of the $n^+$ type source layer 13 and the $p^+$ type contact layer 14. That is, the first main surface in the IGBT region 10 corresponds to upper surfaces of the $n^+$ type source layer 13 and the $p^+$ type contact layer 14 in FIG. 4. The second main surface in the IGBT region 10 corresponds to a surface of the p type collector layer 16. That is, the second main surface in the IGBT region 10 corresponds to a lower surface of the p type collector layer 16 in FIG. 4. In the cross section illustrated in FIG. 4, the semiconductor substrate corresponds to a range from the $n^+$ type source layer 13 and the $p^+$ type contact layer 14 to the p type collector layer 16. The $n^-$ type drift layer 1 is derived from a structure of a substrate prepared before the structures of the semiconductor device are formed on the first main surface side and the second main surface side of the semiconductor substrate. For example, the n⁻ type drift layer 1 corresponds to a semiconductor layer formed by thinning the substrate. The n⁻ type drift layer 1 is a semiconductor layer containing, for example, arsenic (As) or phosphorus (P) as n type impurities. A concentration of the n type impurities is preferably $1.0\ E+12/cm^3$ or more and $1.0\ E+15/cm^3$ or less.

The n type carrier storage layer 2 is provided on the first main surface side of the semiconductor substrate with respect to the n⁻ type drift layer 1. The n type carrier storage layer 2 is a semiconductor layer containing, for example, arsenic or phosphorus as n type impurities. The n type carrier storage layer 2 has a higher concentration of n type impurities than the n⁻ type drift layer 1. The concentration of the n type impurities is preferably $1.0\ E+13/cm^3$ or more and $1.0\ E+17/cm^3$ or less. The n type carrier storage layer 2 reduces current loss when a current flows through the IGBT region 10. The n type carrier storage layer 2 and the n⁻ type drift layer 1 may be collectively defined as one n type drift layer. The n type carrier storage layer 2 is not always necessary. The n⁻ type drift layer 1 may be provided at the position of the n type carrier storage layer 2.

The p type base layer 15 is provided on the first main surface side of the semiconductor substrate with respect to the n type carrier storage layer 2. The p type base layer 15 is a semiconductor layer containing, for example, boron (B) or aluminum (Al) as p type impurities. A concentration of the p type impurities is preferably $1.0\ E+12/cm^3$ or more and $1.0\ E+19/cm^3$ or less. The p type base layer 15 is in contact with the gate trench insulating film 11b of the active trench gate 11. When a gate drive voltage is applied to the gate trench electrode 11a, a channel is formed in the p type base layer 15.

The n⁺ type source layer 13 is provided on the first main surface side of the semiconductor substrate with respect to the p type base layer 15. The n⁺ type source layer 13 is selectively provided on a surface layer of the p type base layer 15. The surface of the n⁺ type source layer 13 constitutes the first main surface of the semiconductor substrate in the IGBT region 10. The n⁺ type source layer 13 is a semiconductor layer containing, for example, arsenic or phosphorus as n type impurities. A concentration of the n type impurities is preferably $1.0\ E+17/cm^3$ or more and $1.0\ E+20/cm^3$ or less. The n⁺ type source layer 13 may be referred to as an n⁺ type emitter layer.

The p⁺ type contact layer 14 is provided on the first main surface side of the semiconductor substrate with respect to the p type base layer 15. The p⁺ type contact layer 14 is provided in a region of the surface layer of the p type base layer 15 where the n⁺ type source layer 13 is not provided. The surface of the p type contact layer 14 constitutes the first main surface of the semiconductor substrate in the IGBT region 10. The p⁺ type contact layer 14 is a semiconductor layer containing, for example, boron or aluminum as p type impurities. A concentration of p type impurities in the p⁺ type contact layer 14 is higher than the concentration of p type impurities in the p type base layer 15. The concentration of the p type impurities is preferably $1.0\ E+15/cm^3$ or more and $1.0\ E+20/cm^3$ or less. The p⁺ type contact layer 14 and the p type base layer 15 may be collectively defined as one p type base layer.

The n type buffer layer 3 is provided on the second main surface side of the semiconductor substrate with respect to the n⁻ type drift layer 1. The n type buffer layer 3 is a semiconductor layer containing, for example, phosphorus or proton (H⁺) as n type impurities. The n type buffer layer 3 has a higher concentration of n type impurities than the n⁻ type drift layer 1. The concentration of the n type impurities is preferably $1.0\ E+12/cm^3$ or more and $1.0\ E+18/cm^3$ or less. The n type buffer layer 3 reduces occurrence of punch-through since a depletion layer extends from the p type base layer 15 to the second main surface side when the semiconductor device 100 is in an off state. The n type buffer layer 3 and the n⁻ type drift layer 1 may be collectively defined as one n type drift layer. Further, the n type carrier storage layer 2, the n type buffer layer 3, and the n⁻ type drift layer 1 may be collectively defined as one n type drift layer. The n type buffer layer 3 is not always necessary. An n⁻ type drift layer 1 may be provided at the position of the n type buffer layer 3.

The p type collector layer 16 is provided on the second main surface side of the semiconductor substrate with respect to the n type buffer layer 3. A surface of the p type collector layer 16 constitutes the second main surface of the semiconductor substrate. The p type collector layer 16 is a semiconductor layer containing, for example, boron or aluminum as p type impurities. A concentration of the p type impurities is preferably $1.0\ E+16/cm^3$ or more and $1.0\ E+20/cm^3$ or less.

The active trench gate 11 penetrates the n⁺ type source layer 13, the p type base layer 15, and the n type carrier storage layer 2 from the first main surface of the semiconductor substrate and reaches the n⁻ type drift layer 1. The gate trench insulating film 11b is formed along an inner wall of a trench formed in the depth direction from the first main surface of the semiconductor substrate. The gate trench electrode 11a is formed inside the trench with the gate trench insulating film 11b interposed therebetween. A bottom of the gate trench electrode 11a faces the n⁻ type drift layer 1 with the gate trench insulating film 11b interposed therebetween. The gate trench insulating film 11b is in contact with the n⁺ type source layer 13 and the p type base layer 15. When a gate drive voltage is applied to the gate trench electrode 11a, a channel is formed in the p type base layer 15 that is in contact with the gate trench insulating film 11b.

The dummy trench gate 12 penetrates the p⁺ type contact layer 14, the p type base layer 15, and the n type carrier storage layer 2 from the first main surface of the semiconductor substrate and reaches the n⁻ type drift layer 1. The dummy trench insulating film 12b is formed along an inner wall of a trench formed in the depth direction from the first main surface of the semiconductor substrate. The dummy trench electrode 12a is formed inside the trench with the dummy trench insulating film 12b interposed therebetween. A bottom of the dummy trench electrode 12a faces the n⁻ type drift layer 1 with the dummy trench insulating film 12b interposed therebetween. The dummy trench insulating film 12b is not in contact with the n⁺ type source layer 13.

The interlayer insulating film 4 is provided on the gate trench electrode 11a of the active trench gate 11.

The barrier metal 5 is formed on the interlayer insulating film 4 and on a region of the first main surface of the semiconductor substrate where the interlayer insulating film 4 is not provided. The barrier metal 5 is formed of for example, a conductor containing titanium (Ti). The conductor containing titanium is, for example, titanium nitride, TiSi, or the like. TiSi is an alloy of titanium and silicon (Si). The barrier metal 5 is in ohmic contact with the n⁺ type source layer 13, the p⁺ type contact layer 14, and the dummy trench electrode 12a. The barrier metal 5 is electrically connected to the n⁺ type source layer 13, the p⁺ type contact layer 14, and the dummy trench electrode 12a.

The emitter electrode 6 is provided on the barrier metal 5. The emitter electrode 6 is formed of, for example, an aluminum alloy (Al—Si based alloy) containing aluminum and silicon. The emitter electrode 6 is electrically connected to the $n^+$ type source layer 13, the $p^+$ type contact layer 14, and the dummy trench electrode 12a via the barrier metal 5.

The emitter electrode 6 may be constituted by a plurality of metal films including an aluminum alloy film and another metal film. For example, the emitter electrode 6 may include an aluminum alloy film and a plating film formed on the aluminum alloy film by electroless plating or electrolytic plating. The plating film is, for example, a nickel (Ni) plating film. A tungsten film may be formed in a fine region such as a region between adjacent interlayer insulating films 4. The emitter electrode 6 is formed so as to cover the tungsten film. Since a tungsten film has a better embedding property than a plating film, a good emitter electrode 6 is formed.

Although an example in which the emitter electrode 6 is provided on the first main surface of the semiconductor substrate with the barrier metal 5 interposed therebetween is illustrated in FIG. 4, the barrier metal 5 is not always necessary. In a case where the barrier metal 5 is not provided, the emitter electrode 6 is provided on the $n^+$ type source layer 13, the $p^+$ type contact layer 14, and the dummy trench electrode 12a and makes ohmic contact with them. Alternatively, the barrier metal 5 may be provided only on an n type semiconductor layer such as the $n^+$ type source layer 13. The barrier metal 5 and the emitter electrode 6 may be collectively defined as one emitter electrode. Further, the interlayer insulating film 4 may be provided on a part of the dummy trench electrode 12a. In this case, it is only necessary that the emitter electrode 6 be electrically connected to the dummy trench electrode 12a in any region on the dummy trench electrode 12a.

The collector electrode 7 is provided on the p type collector layer 16. Similar to the emitter electrode 6, the collector electrode 7 may be made of an aluminum alloy or an aluminum alloy and a plating film. Alternatively, the collector electrode 7 may have a different configuration from the emitter electrode 6. The collector electrode 7 is in ohmic contact with the p type collector layer 16 and is electrically connected to the p type collector layer 16.

FIG. 5 is a cross-sectional view illustrating a configuration of the IGBT region 10 of the semiconductor device according to the first preferred embodiment. FIG. 5 illustrates a cross section taken along line B-B illustrated in FIG. 3.

The cross section taken along line B-B illustrated in FIG. 5 is different from the cross section taken along line A-A illustrated in FIG. 4 in that the $n^+$ type source layer 13 is not provided as a surface layer on the first main surface side of the semiconductor substrate. That is, as illustrated in FIG. 3, the $n^+$ type source layer 13 is selectively provided on the surface layer of the p type base layer 15.

(Structure of Diode Region)

Figure 6:
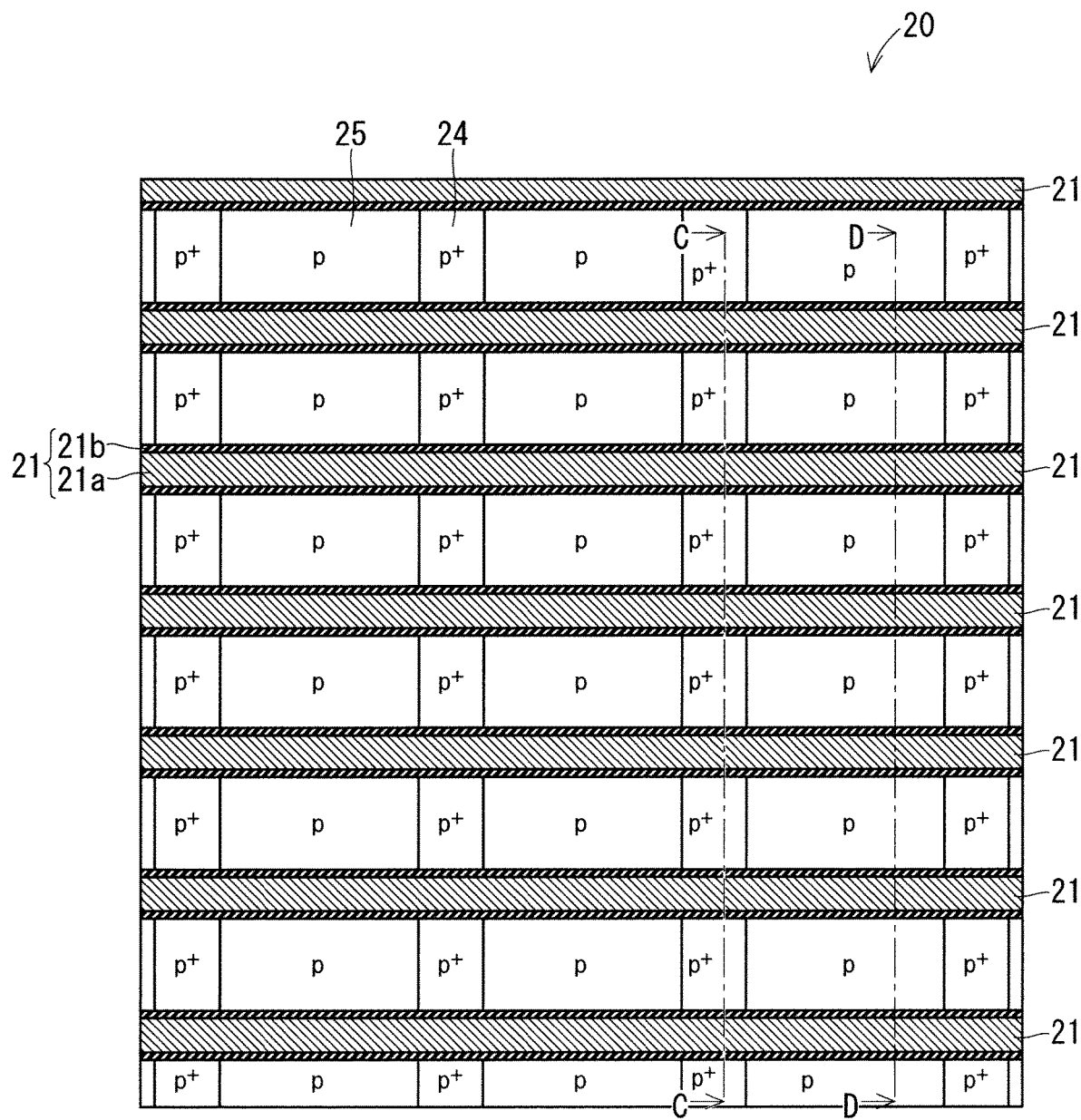
FIG. 6 is a partially enlarged plan view illustrating a configuration of a diode region of the semiconductor device according to the first preferred embodiment.

FIG. 6 is a partially enlarged plan view illustrating a configuration of the diode region 20 of the semiconductor device according to the first preferred embodiment. FIG. 6 is an enlarged view of a region 83 in the semiconductor device 100 illustrated in FIG. 1 or the semiconductor device 101 illustrated in FIG. 2.

The semiconductor device 100 and the semiconductor device 101 each include a diode trench gate 21 provided in the diode region 20.

The diode trench gate 21 extends in one direction in the diode region 20. The diode trench gate 21 in the first preferred embodiment extends in the same direction as the active trench gate 11 and the dummy trench gate 12.

The diode trench gate 21 includes a diode trench insulating film 21b and a diode trench electrode 21a. Although details of a cross-sectional structure of the diode trench gate 21 will be described later, the diode trench insulating film 21b is formed along an inner wall of a trench formed in the depth direction from the first main surface of the semiconductor substrate. The diode trench electrode 21a is formed inside the trench with the diode trench insulating film 21b interposed therebetween.

A $p^+$ type contact layer 24 and a p type anode layer 25 are selectively provided on a surface layer on the first main surface side of the semiconductor substrate on which the diode trench gate 21 is provided. In the first preferred embodiment, the $p^+$ type contact layer 24 and the p type anode layer 25 are alternately provided along the direction (the longitudinal direction) in which the diode trench gate 21 extends. The diode trench gate 21 is provided so as to cross the $p^+$ type contact layer 24 and the p type anode layer 25. The $p^+$ type contact layer 24 and the p type anode layer 25 are provided between two diode trench gates 21 adjacent to each other. Details of the $p^+$ type contact layer 24 and the p type anode layer 25 will be described later.

Figure 7:
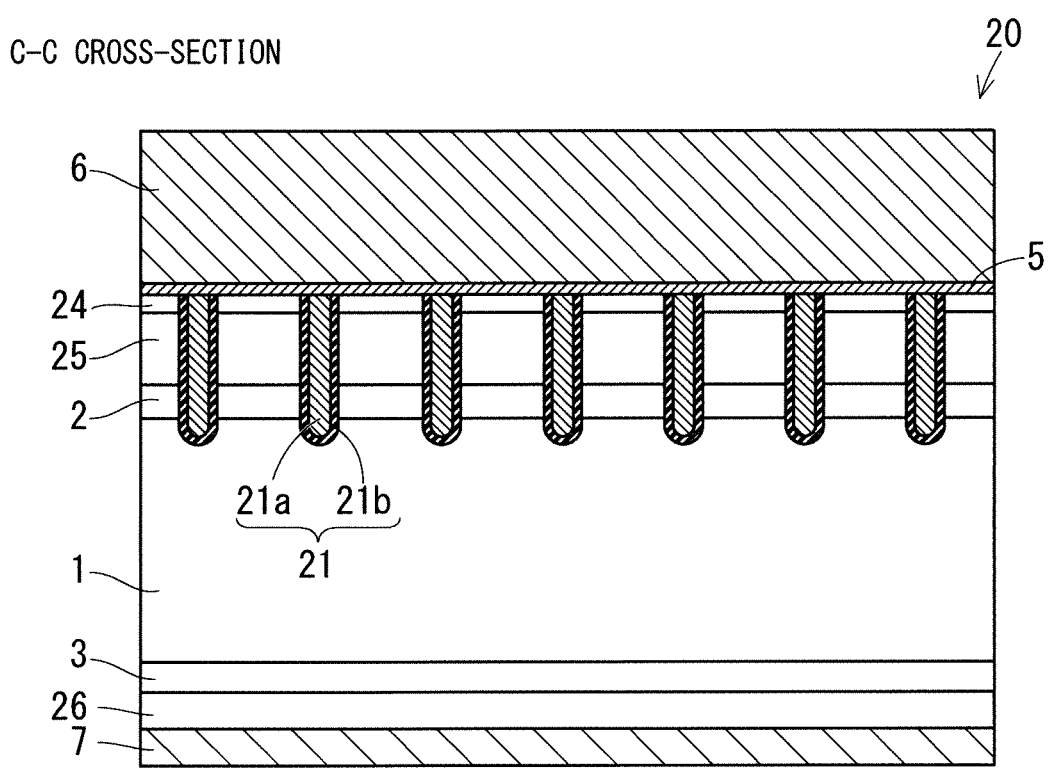
FIG. 7 is a cross-sectional view illustrating a configuration of the diode region of the semiconductor device according to the first preferred embodiment.

FIG. 7 is a cross-sectional view illustrating a configuration of the diode region 20 of the semiconductor device according to the first preferred embodiment. FIG. 7 illustrates a cross section taken along line C-C illustrated in FIG. 6.

The semiconductor device 100 and the semiconductor device 101 each include, in the diode region 20, an $n^-$ type drift layer 1, an n type carrier storage layer 2, the p type anode layer 25, the $p^+$ type contact layer 24, an n type buffer layer 3, an $n^+$ type cathode layer 26, a barrier metal 5, an emitter electrode 6, and collector electrode 7. The diode cell corresponds to, for example, a region partitioned for each diode trench gate 21. Therefore, one diode cell includes the $n^-$ type drift layer 1, the n type carrier storage layer 2, the p type anode layer 25, the $p^+$ type contact layer 24, the n type buffer layer 3, the $n^+$ type cathode layer 26, the barrier metal 5, the emitter electrode 6, and the collector electrode 7.

The $n^-$ type drift layer 1 is formed as an inner layer of the semiconductor substrate. The $n^-$ type drift layer 1 in the diode region 20 is provided between the first main surface and the second main surface of the semiconductor substrate, similarly to the $n^-$ type drift layer 1 in the IGBT region 10. The first main surface in the diode region 20 corresponds to a surface of the $p^+$ type contact layer 24. That is, the first main surface in the diode region 20 corresponds to an upper surface of the $p^+$ type contact layer 24 in FIG. 7. The first main surface in the diode region 20 is continuous from the first main surface in the IGBT region 10. The second main surface in the diode region 20 corresponds to a surface of the $n^+$ type cathode layer 26. That is, the second main surface in the diode region 20 corresponds to a lower surface of the $n^+$ type cathode layer 26 in FIG. 7. The second main surface in the diode region 20 is continuous from the second main surface in the IGBT region 10. In the cross section illustrated in FIG. 7, the semiconductor substrate corresponds to a range from the $p^+$ type contact layer 24 to the $n^-$ type cathode layer 26. The $n^-$ type drift layer 1 in the diode region 20 is derived from a structure of a substrate prepared before the structures are formed on the first main surface side and the second main surface side of the semiconductor substrate, similarly to the $n^-$ type drift layer 1 in the IGBT region 10. That is, the if type drift layers 1 in the diode region 20 and the IGBT region 10 are continuous and integral with each other. In other words, the n⁻ type drift layers 1 in the diode region 20 and the IGBT region 10 are formed on the same semiconductor substrate.

The n type carrier storage layer 2 is provided on the first main surface side of the semiconductor substrate with respect to the if type drift layer 1, as in the IGBT region 10. The n type carrier storage layer 2 provided in the diode region 20 has the same configuration as the n type carrier storage layer 2 provided in the IGBT region 10. The n type carrier storage layer 2 and the if type drift layer 1 may be collectively defined as one n type drift layer. The n type carrier storage layer 2 in the diode region 20 is not always necessary. The n⁻ type drift layer 1 may be provided at the position of the n type carrier storage layer 2. For example, even in a case where the n type carrier storage layer 2 is provided in the IGBT region 10, it is not necessary to provide the n type carrier storage layer 2 in the diode region 20.

The p type anode layer 25 is provided on the first main surface side of the semiconductor substrate with respect to the n type carrier storage layer 2. The p type anode layer 25 is a semiconductor layer containing, for example, boron or aluminum as p type impurities. A concentration of the p type impurities is preferably $1.0\ E+12/cm^3$ or more and $1.0\ E+19/cm^3$ or less. The concentration of p type impurities in the p type anode layer 25 is, for example, the same as the concentration of p type impurities in the p type base layer 15 in the IGBT region 10. In a case where the concentrations of p type impurities are the same, the p type anode layer 25 is, for example, formed at the same time as the p type base layer 15. Alternatively, for example, the concentration of the p type impurities of the p type anode layer 25 may be lower than the concentration of the p type impurities of the p type base layer 15 in the IGBT region 10. In a case where the concentration of p type impurities of the p type anode layer 25 is lower, the amount of holes injected into the diode region 20 during diode operation decreases. Accordingly, a recovery loss during diode operation is reduced.

The p⁺ type contact layer 24 is provided on the first main surface side of the semiconductor substrate with respect to the p type anode layer 25. The p⁺ type contact layer 24 is provided on a surface layer of the p type anode layer 25. A surface of the p⁺ type contact layer 24 constitutes the first main surface of the semiconductor substrate in the diode region 20. The p⁺ type contact layer 24 is a semiconductor layer containing, for example, boron or aluminum as p type impurities. A concentration of p type impurities in the p⁺ type contact layer 24 is higher than the concentration of the p type impurities in the p type anode layer 25. The concentration of the p type impurities is preferably $1.0\ E+15/cm^3$ or more and $1.0\ E+20/cm^3$ or less. The p⁺ type contact layer 24 and the p type anode layer 25 may be collectively defined as one p type anode layer. The concentration of the p type impurities of the p⁺ type contact layer 24 may be the same as or different from the concentration of the p type impurities of the p⁺ type contact layer 14 in the IGBT region 10.

The n type buffer layer 3 is provided on the second main surface side of the semiconductor substrate with respect to the n⁻ type drift layer 1. The n type buffer layer 3 provided in the diode region 20 has the same configuration as the n type buffer layer 3 provided in the IGBT region 10. The n type buffer layer 3 and the n⁻ type drift layer 1 may be collectively defined as one n type drift layer. Further, the n type carrier storage layer 2, the n type buffer layer 3, and the n⁻ type drift layer 1 may be collectively defined as one n type drift layer. The n type buffer layer 3 is not always necessary. An n⁻ type drift layer 1 may be provided at the position of the n type buffer layer 3.

The n⁺ type cathode layer 26 is provided on the second main surface side of the semiconductor substrate with respect to the n type buffer layer 3. A surface of the n⁺ type cathode layer 26 constitutes the second main surface of the semiconductor substrate. The n⁺ type cathode layer 26 is a semiconductor layer containing, for example, arsenic or phosphorus as n type impurities. A concentration of the n type impurities is preferably $1.0\ E+16/cm^3$ or more and $1.0\ E+21/cm^3$ or less.

The n⁺ type cathode layer 26 may be provided in the entire diode region 20 or may be provided in a part of the diode region 20. The semiconductor device 100 and the semiconductor device 101 each may include a semiconductor layer in which the n⁺ type cathode layer 26 and a p⁺ type cathode layer are alternately arranged as a semiconductor layer that constitutes the second main surface of the semiconductor substrate in the diode region 20 although illustration thereof is omitted. Such a structure is formed, for example, by a step of selectively injecting p type impurities into a part of a region where the n⁺ type cathode layer 26 is formed. A diode including a semiconductor layer in which the n⁺ type cathode layer 26 and p⁺ type cathode layer are alternately arranged is called a Relaxed Field of Cathode (RFC) diode.

The diode trench gate 21 penetrates the p⁺ type contact layer 24, the p type anode layer 25, and the n type carrier storage layer 2 from the first main surface of the semiconductor substrate and reaches the n⁻ type drift layer 1. The diode trench insulating film 21b is formed along an inner wall of a trench formed in the depth direction from the first main surface of the semiconductor substrate. The diode trench electrode 21a is formed inside the trench with the diode trench insulating film 21b interposed therebetween. A bottom of the diode trench electrode 21a faces the n⁻ type drift layer 1 with the diode trench insulating film 21b interposed therebetween.

The barrier metal 5 is provided on the diode trench electrode 21a and on the p⁺ type contact layer 24. The barrier metal 5 may have the same configuration as the barrier metal 5 in the IGBT region 10. For example, the barrier metal 5 is formed of a conductor containing titanium. The barrier metal 5 is in ohmic contact with the diode trench electrode 21a and the p⁺ type contact layer 24. The barrier metal 5 is electrically connected to the diode trench electrode 21a and the p⁺ type contact layer 24.

The emitter electrode 6 is provided on the barrier metal 5. The emitter electrode 6 provided in the diode region 20 is formed continuously with the emitter electrode 6 provided in the IGBT region 10. The emitter electrode 6 is electrically connected to the diode trench electrode 21a and the p⁺ type contact layer 24 via the barrier metal 5.

As in the configuration in the IGBT region 10, the barrier metal 5 is not always necessary. In a case where the barrier metal 5 is not provided, the emitter electrode 6 is provided on the diode trench electrode 21a and on the p⁺ type contact layer 24 and makes ohmic contact with them. Although an example in which the interlayer insulating film 4 is not provided on the diode trench electrode 21a is illustrated in FIG. 7, the interlayer insulating film 4 may be provided on a part of the diode trench electrode 21a. In this case, it is only necessary that the emitter electrode 6 be electrically connected to the diode trench electrode 21a in any region on the diode trench electrode 21a.

The collector electrode 7 is provided on the n⁺ type cathode layer 26. The collector electrode 7 in the diode region 20 is formed continuously with the collector electrode 7 provided in the IGBT region 10. The collector electrode 7 is in ohmic contact with the n+ type cathode layer 26 and is electrically connected to the n+ type cathode layer 26.

Figure 8:
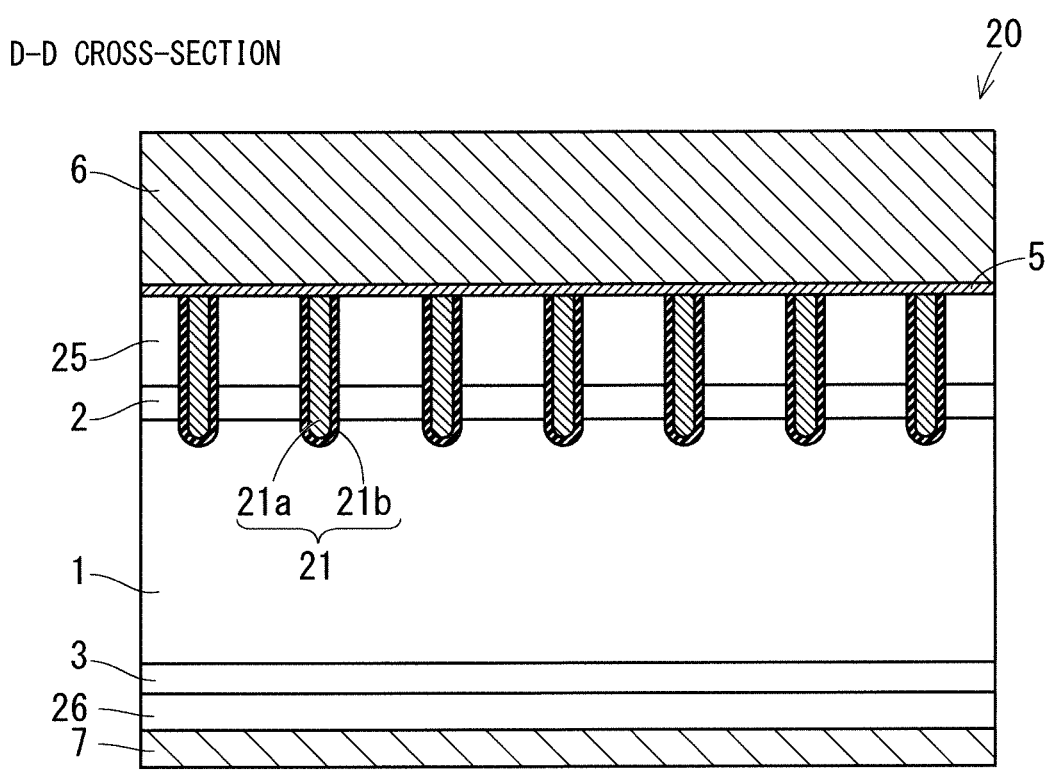
FIG. 8 is a cross-sectional view illustrating a configuration of the diode region of the semiconductor device according to the first preferred embodiment.

FIG. 8 is a cross-sectional view illustrating a configuration of the diode region 20 of the semiconductor device according to the first preferred embodiment. FIG. 8 illustrates a cross section taken along line D-D illustrated in FIG. 6.

The cross section taken along line D-D illustrated in FIG. 8 is different from the cross section taken along line C-C illustrated in FIG. 7 in that the p+ type contact layer 24 on the first main surface side of the semiconductor substrate is not provided. That is, in FIG. 6, the p+ type contact layer 24 is selectively provided on a surface layer of the p type anode layer 25. In a part of the diode region 20 where the p+ type contact layer 24 is not provided, a surface of the p type anode layer 25 corresponds to the first main surface of the semiconductor substrate.

(Structure of Boundary Portion Between IGBT Region and Diode Region)

Figure 9:
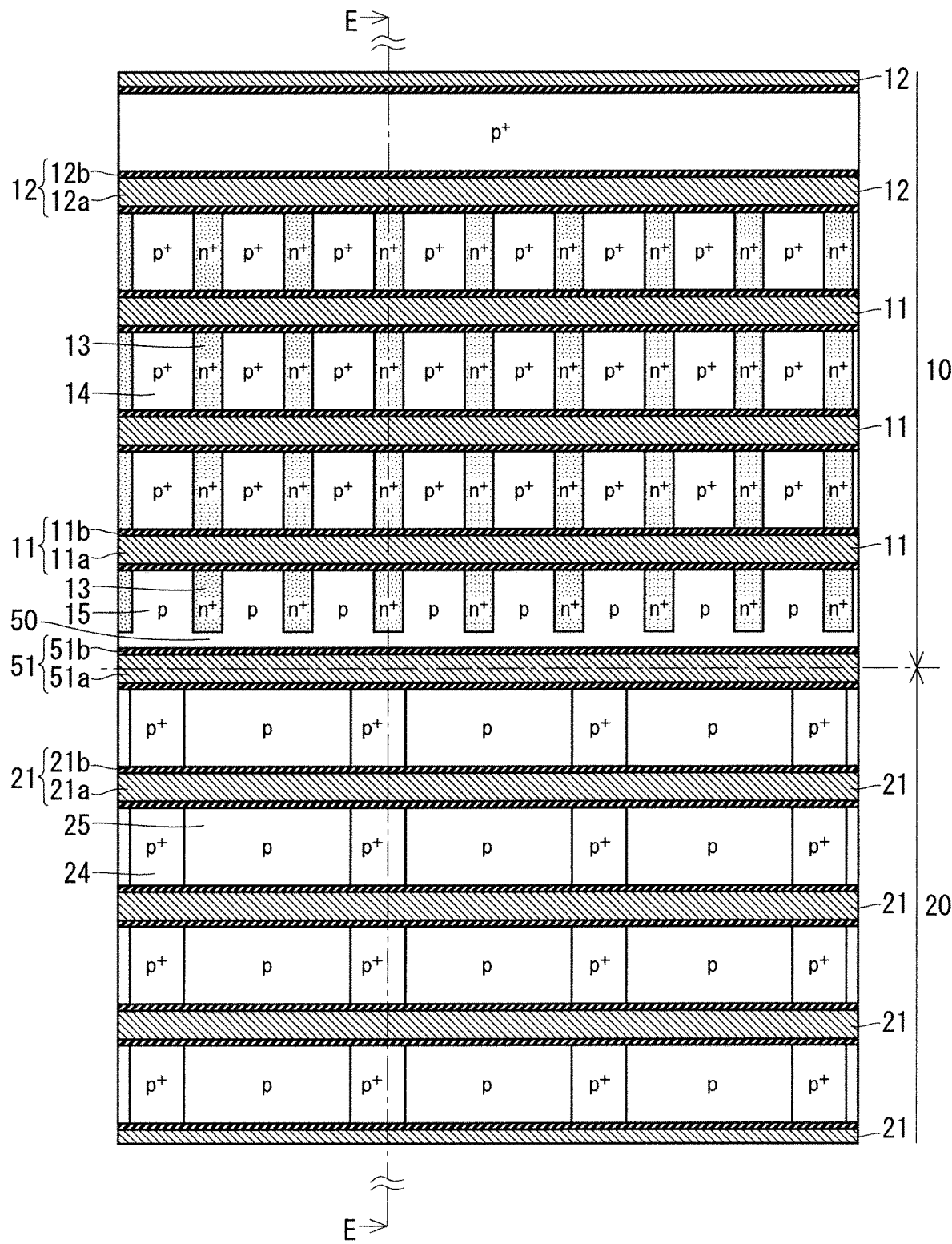
FIG. 9 is a plan view illustrating a configuration of a boundary portion between the IGBT region and the diode region.
Figure 10:
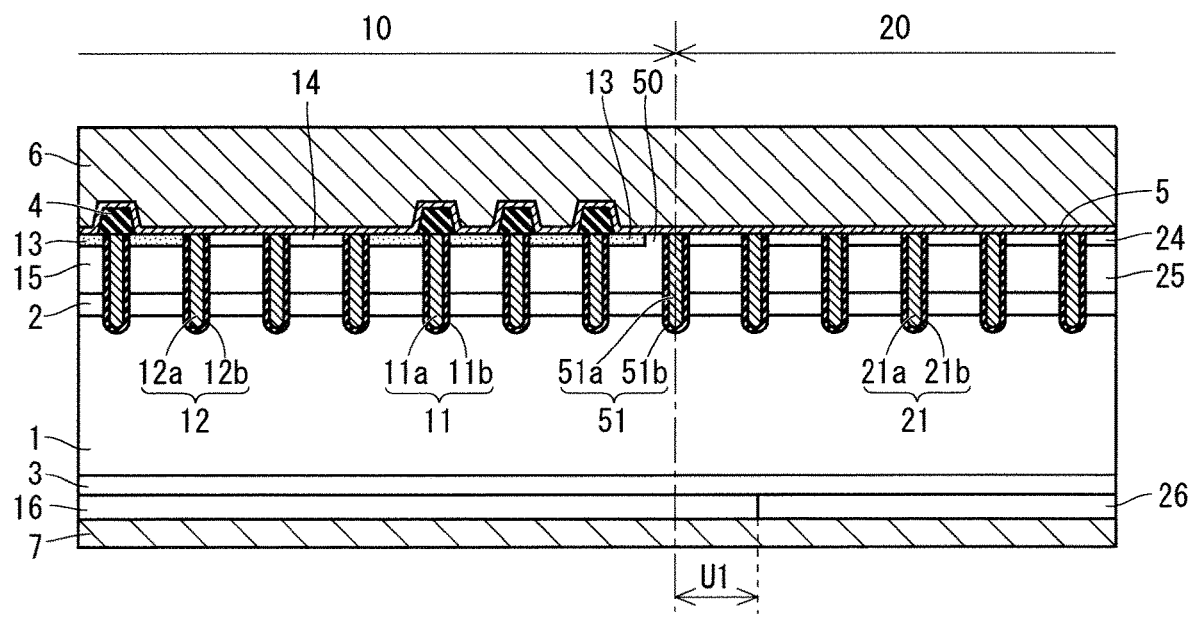
FIG. 10 is a cross-sectional view illustrating a configuration of the boundary portion between the IGBT region and the diode region.

FIG. 9 is a plan view illustrating a configuration of a boundary portion between the IGBT region 10 and the diode region 20. FIG. 10 is a cross-sectional view illustrating the configuration of the boundary portion between the IGBT region 10 and the diode region 20. FIG. 10 illustrates a cross section taken along line E-E illustrated in FIGS. 1, 2 and 9. However, illustration of an active trench gate 11 and an adjacent dummy trench gate 12 illustrated on a leftmost side of FIG. 10 is omitted in FIG. 9. Similarly, illustration of a diode trench gate 21 illustrated on a rightmost side of FIG. 10 is omitted in FIG. 9.

The semiconductor device 100 and the semiconductor device 101 each include a boundary trench gate 51 and a carrier control region 50.

The boundary trench gate 51 is provided in the boundary portion between the IGBT region 10 and the diode region 20. The boundary trench gate 51 is located next to an active trench gate closest to the diode region 20 among the active trench gates 11 provided in the IGBT region 10. Further, the boundary trench gate 51 is located on the diode region 20 side with respect to the active trench gate closest to the diode region 20.

In a region between the boundary trench gate 51 and the active trench gate 11 closest to the boundary trench gate 51, the n+ type source layer 13 is selectively provided on a surface layer of the p type base layer 15. The p+ type contact layer 14 is not provided in this region. Surfaces of the n+ type source layer 13 and the p type base layer 15 constitute the first main surface of the semiconductor substrate. The n+ type source layer 13 and the p type base layer 15 are alternately provided along a direction (the longitudinal direction) in which the active trench gate 11 and the boundary trench gate 51 extend.

The carrier control region 50 is provided closer to the boundary trench gate 51 than the n+ type source layer 13 located between the boundary trench gate 51 and the active trench gate 11 closest to the boundary trench gate 51. The carrier control region 50 is provided as a surface layer on the first main surface side of the semiconductor substrate. A concentration of n type impurities contained in the carrier control region 50 is lower than the concentration of the n type impurities contained in the n+ type source layer 13.

The carrier control region 50 in the first preferred embodiment is the p type base layer 15 located between the n+ type source layer 13 and the boundary trench gate 51. As illustrated in FIG. 10, the p type base layer 15 surrounds an end of the n+ type source layer 13 from below the n+ type source layer 13 and is exposed on the first main surface of the semiconductor substrate. That is, the p type base layer 15 forms a surface layer of the semiconductor substrate between the n+ type source layer 13 and the boundary trench gate 51. The p type base layer 15 as the carrier control region 50 is in contact with the boundary trench gate 51. Although details of methods for manufacturing the semiconductor device 100 and the semiconductor device 101 will be described later, the n+ type source layer 13 is formed by injecting n type impurities into the surface layer of the p type base layer 15. Accordingly, a concentration of n type impurities contained in the p type base layer 15 between the n+ type source layer 13 and the boundary trench gate 51 is lower than the concentration of the n type impurities contained in the n+ type source layer 13.

The n+ type source layer 13 between the boundary trench gate 51 and the active trench gate 11 is in contact with the active trench gate 11 but is not in contact with the boundary trench gate 51. The boundary trench gate 51 does not constitute an IGBT cell and is different from the active trench gate 11.

The boundary trench gate 51 penetrates the p type base layer 15 and the n type carrier storage layer 2 from the first main surface of the semiconductor substrate and reaches the n− type drift layer 1. The boundary trench gate 51 includes a boundary trench insulating film 51b and a boundary trench electrode 51a. The boundary trench insulating film 51b is formed along an inner wall of a trench formed in the depth direction from the first main surface of the semiconductor substrate. The boundary trench electrode 51a is formed inside the trench with the boundary trench insulating film 51b interposed therebetween. A bottom of the boundary trench electrode 51a faces the if type drift layer 1 with the boundary trench insulating film 51b interposed therebetween.

The barrier metal 5 extends from the IGBT region 10 and the diode region 20 and is also provided on the boundary trench electrode 51a. The barrier metal 5 is in ohmic contact with the boundary trench electrode 51a. The barrier metal 5 is electrically connected to the boundary trench electrode 51a. The emitter electrode 6 is electrically connected to the boundary trench electrode 51a via the barrier metal 5.

The p type collector layer 16 provided on the second main surface side of the IGBT region 10 is provided so as to protrude into the diode region 20 by a distance U1 from the boundary between the IGBT region 10 and the diode region 20. A distance between the n+ type cathode layer 26 and the active trench gate 11 is larger than that in a structure in which the p type collector layer 16 does not protrude into the diode region 20. Such a structure reduces a current that flows from a channel formed adjacent to the active trench gate 11 to the n+ type cathode layer 26 even when a gate drive voltage is applied to the gate trench electrode 11a during operation of the freewheeling diode. The distance U1 is, for example, 100 μm. However, the distance U1 may be 0 μm or may be smaller than 100 μm depending on the application of the semiconductor device 100 or the semiconductor device 101. However, the boundary trench gate 51 is not defined, for example, by the arrangement of the p type collector layer 16 provided on the second main surface side of the semiconductor substrate.

(Structure of Terminal Region)

Figure 11:
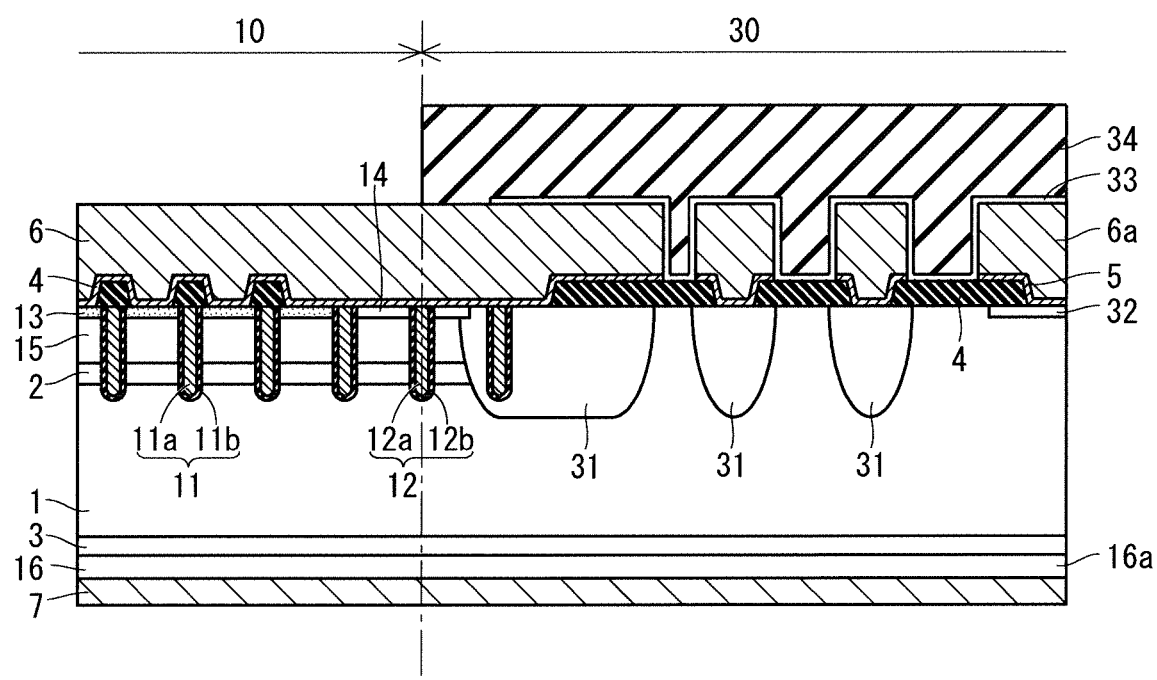
FIG. 11 is a cross-sectional view illustrating a configuration of a boundary portion between the IGBT region and a terminal region.
Figure 12:
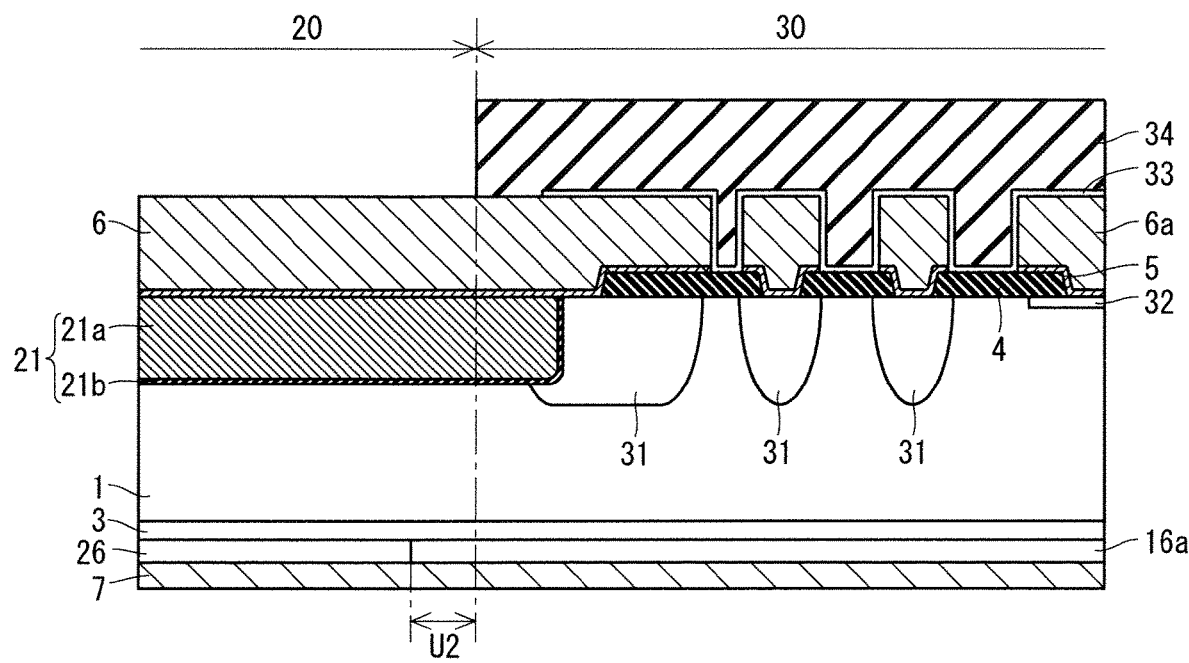
FIG. 12 is a cross-sectional view illustrating a configuration of the boundary portion between the diode region and the terminal region.

FIG. 11 is a cross-sectional view illustrating a configuration of a boundary portion between the IGBT region 10 and the terminal region 30. FIG. 11 illustrates a cross section taken along line F-F illustrated in FIG. 1 or 2. FIG. 12 is a cross-sectional view illustrating a configuration of the boundary portion between the diode region 20 and the terminal region 30. FIG. 12 illustrates a cross section taken along line G-G illustrated in FIG. 1.

The semiconductor device 100 and the semiconductor device 101 each include, in the terminal region 30, an n⁻ type drift layer 1, a p type terminal well layer 31, an n⁺ type channel stopper layer 32, an n type buffer layer 3, a p type terminal collector layer 16a, an interlayer insulating film 4, a barrier metal 5, an emitter electrode 6, a terminal electrode 6a, a semi-insulating film 33, a terminal protective film 34, and a collector electrode 7.

The n⁻ type drift layer 1 in the terminal region 30 is provided between the first main surface and the second main surface of the semiconductor substrate, similarly to the n⁻ type drift layers 1 in the IGBT region 10 and the diode region 20. However, a part of the n⁻ type drift layer 1 in the terminal region 30 is exposed on the first main surface as a surface layer of the semiconductor substrate. The first main surface in the terminal region 30 corresponds to surfaces of the n⁻ type drift layer 1, the p type terminal well layer 31, and the n⁺ type channel stopper layer 32. That is, the first main surface in the terminal region 30 corresponds to upper surfaces of the n⁻ type drift layer 1, the p type terminal well layer 31, and the n⁺ type channel stopper layer 32 in FIG. 11. The first main surface in the terminal region 30 is continuous from the first main surface in the IGBT region 10 or the diode region 20. The second main surface in the terminal region 30 corresponds to a surface of the p type terminal collector layer 16a. That is, the second main surface in the terminal region 30 corresponds to a lower surface of the p type terminal collector layer 16a in FIG. 11. The second main surface in the terminal region 30 is continuous from the second main surface in the IGBT region 10 or the diode region 20. The n⁻ type drift layer 1 in the terminal region 30 is derived from a structure of a substrate prepared before the structures are formed on the first main surface side or the second main surface side of the semiconductor substrate, similarly to the n⁻ type drift layer 1 in the IGBT region 10 and the diode region 20. That is, the n⁻ type drift layers 1 in the terminal region 30, the IGBT region 10, and the diode region 20 are continuous and integral with each other. In other words, the n⁻ type drift layers 1 in the terminal region 30, the IGBT region 10, and the diode region 20 are formed on the same semiconductor substrate.

The p type terminal well layer 31 is provided on the first main surface side of the semiconductor substrate with respect to the n⁻ type drift layer 1. The p type terminal well layer 31 is provided so as to surround a cell region in a plan view. In the first preferred embodiment, three p type terminal well layers 31 form a triple ring in plan view and surround the cell region. The three p type terminal well layers 31 form an FLR. The number of p type terminal well layers 31 is not limited to three. The number of p type terminal well layers 31 is appropriately selected depending on the withstand voltage design of the semiconductor device 100 or the semiconductor device 101. The p type terminal well layer 31 is a semiconductor layer containing, for example, boron or aluminum as p type impurities. A concentration of the p type impurities is 1.0 E+14/cm³ or more and 1.0 E+19/cm³ or less.

The n⁺ type channel stopper layer 32 is provided on the first main surface side of the semiconductor substrate with respect to the n⁻ type drift layer 1. The n⁺ type channel stopper layer 32 is provided on an outer side of the p type terminal well layer 31 in plan view. The n⁺ type channel stopper layer 32 is provided so as to surround the p type terminal well layer 31.

The n type buffer layer 3 is provided on the second main surface side of the semiconductor substrate with respect to the n⁻ type drift layer 1. The n type buffer layer 3 provided in the terminal region 30 has a similar configuration to the n type buffer layer 3 provided in the IGBT region 10 or the diode region 20. The n type buffer layer 3 provided in the terminal region 30 is continuously and integrally formed with the n type buffer layer 3 provided in the IGBT region 10 or the diode region 20. The n type buffer layer 3 and the n⁻ type drift layer 1 may be collectively defined as one n type drift layer. The n type buffer layer 3 is not always necessary. An n⁻ type drift layer 1 may be provided at the position of the n type buffer layer 3.

The p type terminal collector layer 16a is provided on the second main surface side of the semiconductor substrate with respect to the n type buffer layer 3. The p type terminal collector layer 16a has a similar configuration to the p type collector layer 16 provided in the IGBT region 10. The p type terminal collector layer 16a is continuously and integrally formed with the p type collector layer 16 provided in the IGBT region 10. The p type terminal collector layer 16a in the terminal region 30 and the p type collector layer 16 in the IGBT region 10 may be collectively defined as one p type collector layer.

As illustrated in FIG. 12, the p type terminal collector layer 16a is provided so as to protrude into the diode region 20 by a distance U2 from the boundary between the diode region 20 and the terminal region 30. A distance between the n⁺ type cathode layer 26 and the p type terminal well layer 31 is larger than that in a structure in which the p type terminal collector layer 16a does not protrude into the diode region 20. Such a structure prevents the p type terminal well layer 31 from operating as an anode of the freewheeling diode. The distance U2 is, for example, 100 μm.

The interlayer insulating film 4 is provided on the first main surface of the semiconductor substrate. The interlayer insulating film 4 has contact holes. The contact holes are provided corresponding to the positions of the p type terminal well layer 31 and the n⁺ type channel stopper layer 32. Surfaces of the p type terminal well layer 31 and the n⁺ type channel stopper layer 32 are exposed from the contact holes.

The barrier metal 5 is provided on the p type terminal well layer 31 and on the n⁺ type channel stopper layer 32.

The emitter electrode 6 is provided so as to be electrically connected to the p type terminal well layer 31 close to the IGBT region 10 or the diode region 20 via the barrier metal 5. The emitter electrode 6 in the terminal region 30 is formed continuously and integrally with the emitter electrode 6 in the IGBT region 10 or the diode region 20.

The terminal electrode 6a is separated from the emitter electrode 6 and is provided on an outer side of the emitter electrode 6. The terminal electrode 6a is electrically connected to the p type terminal well layer 31 and the n⁺ type channel stopper layer 32 via the barrier metal 5 in the contact hole.

The semi-insulating film 33 is provided so as to electrically connect the emitter electrode 6 and the terminal electrode 6a. The semi-insulating film 33 is, for example, a semi-insulating silicon nitride (sin SiN).

The terminal protective film 34 covers the emitter electrode 6, the terminal electrode 6a, and the semi-insulating film 33. The terminal protective film 34 is formed of, for example, polyimide.

The collector electrode 7 is provided on the p type terminal collector layer 16a, that is, on the second main surface of the semiconductor substrate. The collector electrode 7 in the terminal region 30 is formed continuously and integrally with the collector electrodes 7 in the IGBT region 10 and the diode region 20.

(Method for Manufacturing Semiconductor Device)

FIGS. 13 to 24 are diagrams illustrating a method for manufacturing a semiconductor device according to the first preferred embodiment. FIGS. 13 to 20 illustrate steps of forming structures on the first main surface side of the semiconductor device. FIGS. 21 to 24 illustrate steps of forming structures on the second main surface side of the semiconductor device. Each drawing illustrates a cross section of the boundary portion between the IGBT region 10 and the diode region 20, that is, a cross section taken along line E-E illustrated in FIG. 1 or FIG. 2.

Figure 13:
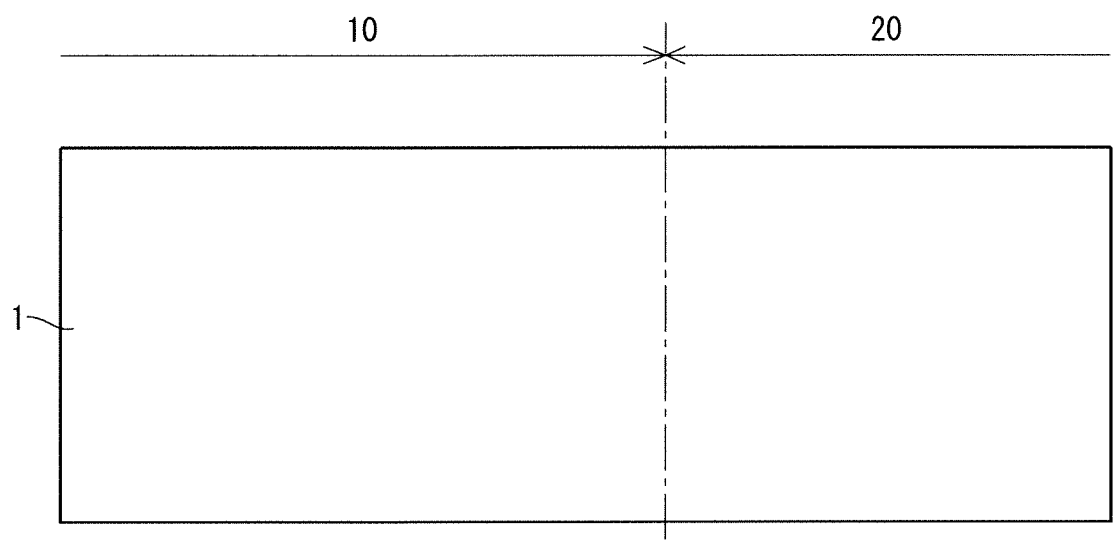
FIG. 13 is a diagram illustrating a step of preparing a semiconductor substrate.

FIG. 13 is a diagram illustrating a step of preparing a semiconductor substrate. In the first preferred embodiment, an n type wafer containing n type impurities is prepared as a semiconductor substrate. In this step, the entire semiconductor substrate corresponds to the n type drift layer 1. A concentration of the n type impurities is appropriately selected according to the withstand voltage specifications of the semiconductor device 100 or the semiconductor device 101. For example, in a ease where the withstand voltage specification of the semiconductor device is 1200 V, the concentration of the n type impurities is adjusted so that specific resistance of the n⁻ type drift layer 1 ranges from about 40 Ω·cm to 120 Ω·cm. Although FIG. 13 illustrates a step of preparing an n type wafer as a semiconductor substrate, the whole of which becomes the n type drift layer 1, the step of preparing the semiconductor substrate is not limited to this. For example, a semiconductor substrate including the n⁻ type drift layer 1 may be prepared by a step of ion-implanting n type impurities from the first main surface or the second main surface of the semiconductor substrate and a step of diffusing the n type impurities by thermal treatment. The semiconductor substrate may be a so-called FZ wafer manufactured by a Floating Zone (FZ) method or may be a so-called MCZ wafer manufactured by a Magnetic field applied CZochralki (MCZ) method. Alternatively, the semiconductor substrate may be a wafer manufactured by a sublimation method or chemical vapor deposition (CVD).

In the semiconductor substrate, the IGBT region 10, in which IGBT cells are to be arranged, and the diode region 20, in which diode cells are to be arranged, are decided in advance according to the configuration of the semiconductor device 100 or the semiconductor device 101. The terminal region 30 (not illustrated in FIG. 13), in which the withstand voltage holding structure is to be formed, is decided in advance around the IGBT region 10 and the diode region 20. The following mainly describes a method for manufacturing the structures in the IGBT region 10 and the diode region 20.

FIG. 14 is a diagram illustrating a step of forming the n type carrier storage layer 2, the p type base layer 15, and the p type anode layer 25. N type impurities for forming the n type carrier storage layer 2 are ion-implanted into a surface layer of the n⁻ type drift layer 1 from the first main surface side of the semiconductor substrate. The n type impurities are, for example, phosphorus. The p type impurities for forming the p type base layer 15 and the p type anode layer 25 are ion-implanted into the first main surface of the semiconductor substrate. The p type impurities are, for example, boron. Heat treatment is performed after the ion implantation. By the heat treatment, the n type impurities and the p type impurities are diffused to form the n type carrier storage layer 2, the p type base layer 15, and the p type anode layer 25.

At the time of the ion implantation, a mask having an opening in a predetermined region is formed on the first main surface of the semiconductor substrate. The n type impurities and p type impurities are injected into the region corresponding to the opening of the mask. The mask is formed by a step of coating a resist to the first main surface of the semiconductor substrate and a step of forming an opening in a predetermined region of the resist by photolithography. Hereinafter, such a process of forming a mask having an opening in a predetermined region is referred to as a masking process. The n type impurities and the p type impurities are injected into the predetermined region by the masking process. As a result, the n type carrier storage layer 2, the p type base layer 15, and the p type anode layer 25 are selectively formed within a plane of the first main surface of the semiconductor substrate.

In a case where the p type base layer 15 and the p type anode layer 25 have the same configuration, that is, in a case where the p type base layer 15 and the p type anode layer 25 have the same depth and the same concentration of the p type impurities, the p type impurities are ion-implanted at the same time. On the other hand, in a case where the p type base layer 15 and the p type anode layer 25 have different configurations, that is, in a case where the p type base layer 15 and the p type anode layer 25 have different depths or different concentrations of the p type impurities, the p type impurities for the p type base layer 15 and the p type impurities for the p type anode layer 25 are ion-implanted separately by the masking process. For example, the p type impurities for the p type base layer 15 are ion-implanted through an opening provided in the IGBT region 10. The p type impurities for the p type anode layer 25 are ion-implanted through an opening provided in the diode region 20.

A step of forming an FLR having the p type terminal well layer 31 as the withstand voltage holding structure in the terminal region 30 (not illustrated) may be performed before processing of the IGBT region 10 and the diode region 20 or may be performed concurrently with the ion implantation of the p type impurities into the IGBT region 10 or the diode region 20. For example, in a case where the p type terminal well layer 31 in the terminal region 30 has the same configuration as the p type anode layer 25, the p type impurities for the p type terminal well layer 31 are ion-implanted at the same time as the p type impurities for the p type anode layer 25. As a result, the p type terminal well layer 31 and the p type anode layer 25 having the same depth and p type impurity concentration are totaled. In a case where the p type terminal well layer 31 and the p type anode layer 25 have different depths or p type impurity concentrations, the p type impurities for the p type terminal well layer 31 and the p type impurities for the p type anode layer 25 are ion-implanted separately by the masking process. Even in a case where the p type terminal well layer 31 and the p type anode layer 25 have different configurations, the p type impurities for the p type terminal well layer 31 may be ion-implanted at the same time as the p type impurities for the p type anode layer 25. However, a mesh shape is formed in an opening of the mask in at least one of the region where the p type terminal well layer 31 is to be formed and the region where the p type anode layer 25 is to be formed. Since an aperture ratio is reduced by the mesh shape, an amount of p type impurities injected into the semiconductor substrate is controlled. Although a formation relationship between the p type terminal well layer 31 and the p type anode layer 25 has been described, the same applies to a formation relationship between the p type terminal well layer 31 and the p type base layer 15. Furthermore, the p type impurities for forming the p type terminal well layer 31, the p type base layer 15, and the p type anode layer 25 may be ion-implanted at the same time. The n type carrier storage layer 2 and the p type base layer 15 are formed in the IGBT region 10 and are connected to the p type terminal well layer 31 in the terminal region 30. The n type carrier storage layer 2 and the p type anode layer 25 are formed in the diode region 20 and are connected to the p type terminal well layer 31 in the terminal region 30.

Figure 15:
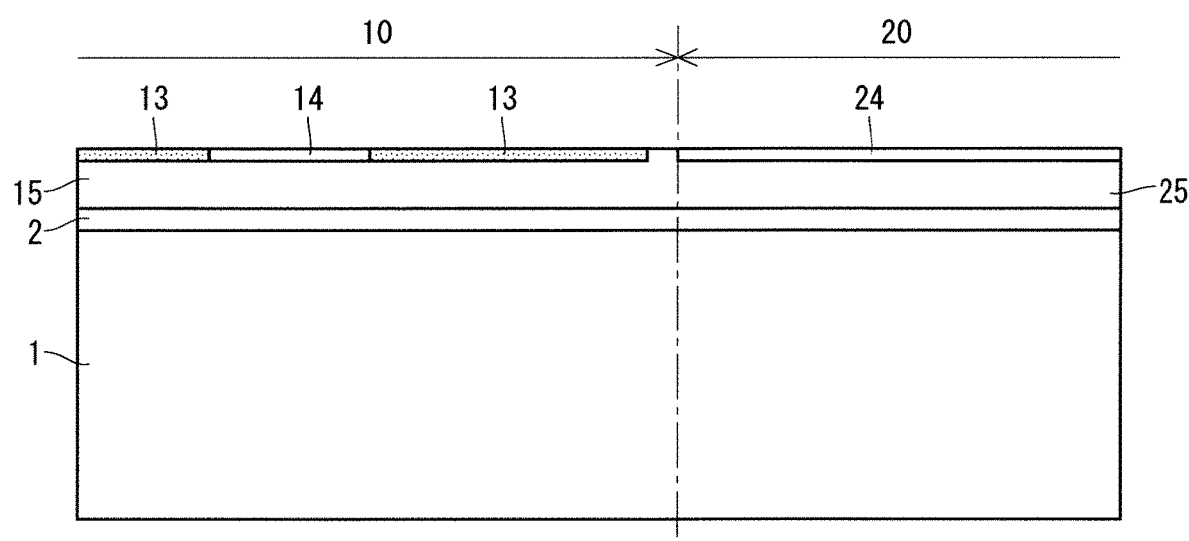
FIG. 15 is a diagram illustrating a step of forming an $n^+$ type source layer, a $p^+$ type contact layer, and a $p^+$ type contact layer.

FIG. 15 is a diagram illustrating a step of forming the $n^+$ type source layer 13, the $p^+$ type contact layer 14, and the $p^+$ type contact layer 24. The n type impurities for forming the $n^+$ type source layer 13 are ion-implanted into a surface layer of the p type base layer 15 from the first main surface side of the semiconductor substrate. The n type impurities are, for example, arsenic or phosphorus. In this step, a mask is disposed so that the n type impurities are injected only into a predetermined region in the IGBT region 10. By this masking process, the $n^+$ type source layer 13 is selectively formed in a surface layer of the p type base layer 15 in the IGBT region 10. In particular, in the first preferred embodiment, a mask is disposed so that the n type impurities are not injected into a part of the IGBT region 10 that is adjacent to the diode region 20. As a result, the p type base layer 15 as the carrier control region 50 remains at an end of the IGBT region 10.

Similarly, the p type impurities for forming the $p^+$ type contact layer 14 and the $p^+$ type contact layer 24 are ion-implanted from the first main surface side of the semiconductor substrate. The p type impurities are, for example, boron or aluminum. In this step, a mask is disposed so that the p type impurities are injected only into a predetermined region in the IGBT region 10 and a predetermined region in the diode region 20. By this masking process, the $p^+$ type contact layer 14 and the $p^+$ type contact layer 24 are selectively formed in the surface layer of the p type base layer 15 in the IGBT region 10 and the diode region 20, respectively.

FIG. 16 is a diagram illustrating a process of forming trenches 8. The trenches 8 are formed by a step of depositing a material for a hard mask on the first main surface of a semiconductor substrate, a step of forming a hard mask including openings in portions corresponding to the trenches 8 by photolithography, and a step of etching the semiconductor substrate through the hard mask. The hard mask is, for example, a thin film such as $SiO_2$. Among the plurality of trenches 8, a trench 8a is formed in the boundary portion between the IGBT region 10 and the diode region 20. The trench 8a is formed so as not to make contact with the $n^+$ type source layer 13. In other words, the trench 8a disposed in the boundary portion between the IGBT region 10 and the diode region 20 is formed away by a predetermined distance from the end of the $n^+$ type source layer 13 formed in the IGBT region 10.

The trenches 8 in the IGBT region 10 penetrate the p type base layer 15 and the n type carrier storage layer 2 from the first main surface of the semiconductor substrate and reach the $n^-$ type drift layer 1. Some of the trenches 8 formed in the IGBT region 10 also penetrate the $n^+$ type source layer 13. The trenches 8 in the diode region 20 penetrate the p type anode layer 25 and the n type carrier storage layer 2 from the first main surface of the semiconductor substrate and reach the $n^-$ type drift layer 1.

In FIG. 16, a pitch of the trenches 8 in the IGBT region 10 is the same as a pitch of the trenches 8 in the diode region 20. However, the pitch of the trenches 8 in the IGBT region 10 may be different from the pitch of the trenches 8 in the diode region 20. The pitch of the trenches 8 is appropriately changed depending on a mask pattern in the masking process.

FIG. 17 is a diagram illustrating a step of forming an oxide film 9. The semiconductor substrate is heated in an atmosphere containing oxygen. The oxide film 9 is formed on inner walls of the trenches 8 and the first main surface of the semiconductor substrate. Of the oxide film 9 formed on the inner walls of the trenches 8, the oxide film 9 formed in the trenches 8 of the IGBT region 10 corresponds to the gate trench insulating film 11b of the active trench gate 11 or the dummy trench insulating film 12b of the dummy trench gate 12. The oxide film 9 formed on the inner walls of the trenches 8 penetrating the $n^+$ type source layer 13 is the gate trench insulating film 11b. The oxide film 9 formed in the trenches 8 of the diode region 20 corresponds to the diode trench insulating film 21b of the diode trench gate 21. The oxide film 9 formed in the trench 8a located in the boundary portion between the IGBT region 10 and the diode region 20 corresponds to the boundary trench insulating film 51b of the boundary trench gate 51. The oxide film 9 formed on the first main surface of the semiconductor substrate is removed in a later step.

FIG. 18 is a diagram illustrating a step of forming the gate trench electrode 11a, the dummy trench electrode 12a, the diode trench electrode 21a, and the boundary trench electrode 51a. Polysilicon doped with n type or p type impurities is deposited inside the trenches 8 by a method such as chemical vapor deposition (CVD). As a result, the gate trench electrode 11a is formed inside the trenches 8 with the gate trench insulating film 11b interposed therebetween. The dummy trench electrode 12a is formed inside the trenches 8 with the dummy trench insulating film 12b interposed therebetween. The diode trench electrode 21a is formed inside the trenches 8 with the diode trench insulating film 21b interposed therebetween. The boundary trench electrode 51a is formed inside the trench 8a with the boundary trench insulating film 51b interposed therebetween.

Figure 19:
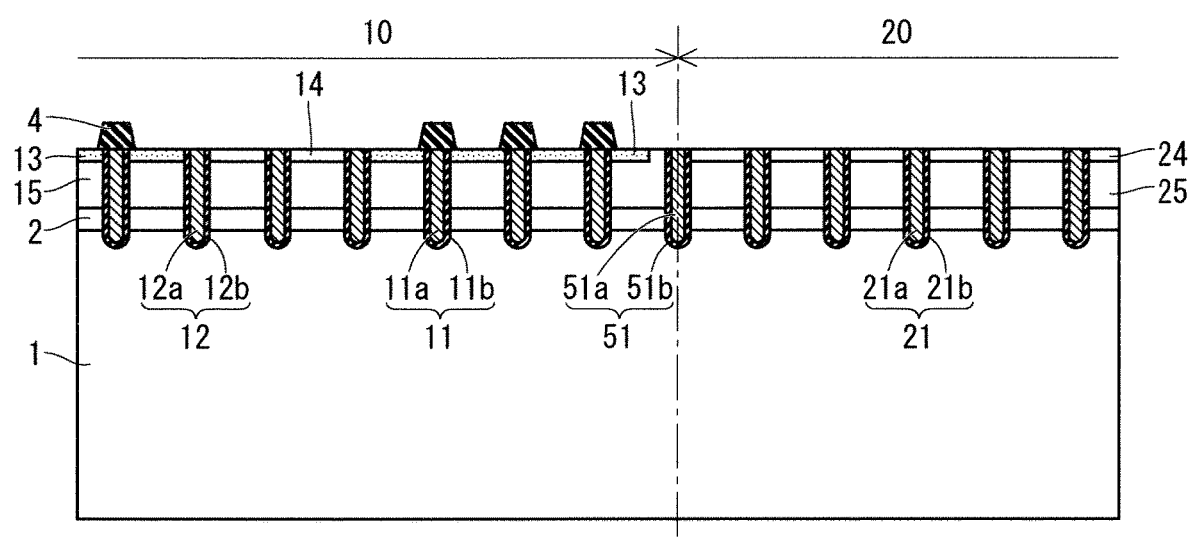
FIG. 19 is a diagram illustrating a step of forming an interlayer insulating film.

FIG. 19 is a diagram illustrating a step of forming the interlayer insulating film 4. The interlayer insulating film 4 is formed on the gate trench electrode 11a in the IGBT region 10. The interlayer insulating film 4 contains, for example, $SiO_2$. Then, contact holes are formed in the interlayer insulating film 4 by a masking process. The contact holes are formed so that the $n^+$ type source layer 13, the $p^+$ type contact layer 14, the $p^+$ type contact layer 24, the dummy trench electrode 12a, the diode trench electrode 21a, and the boundary trench electrode 51a are exposed. Further, in these steps, the oxide film 9 formed on the first main surface of the semiconductor substrate is removed.

Figure 20:
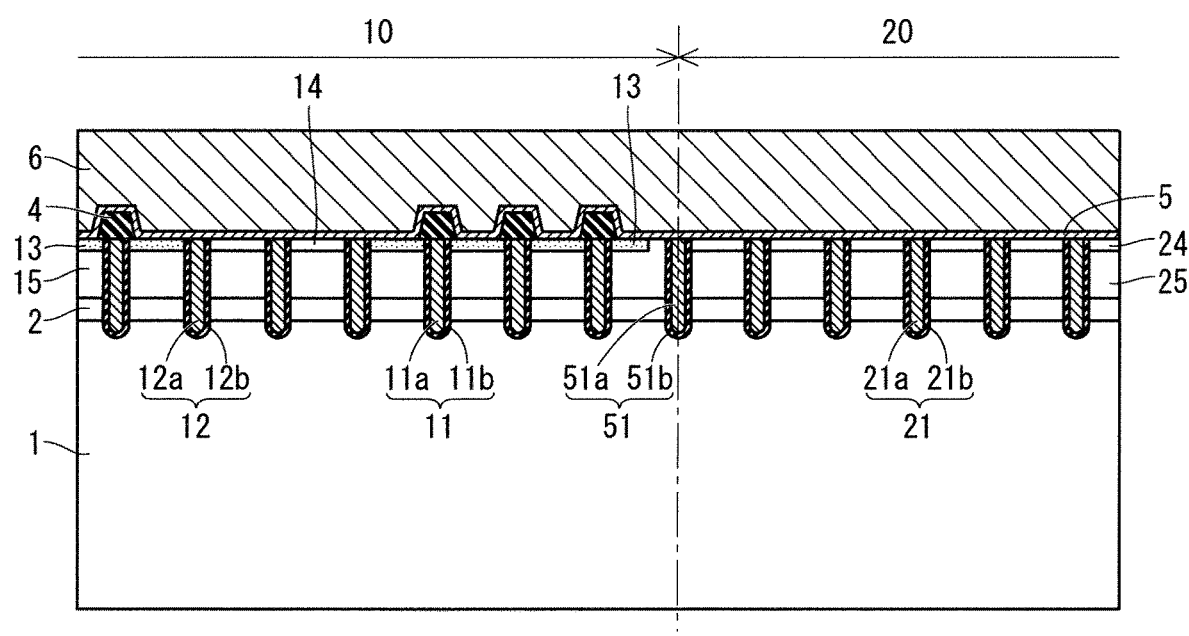
FIG. 20 is a diagram illustrating a step of forming a barrier metal and an emitter electrode.

FIG. 20 is a diagram illustrating a step of forming the barrier metal 5 and the emitter electrode 6. The barrier metal 5 is formed on the first main surface of the semiconductor substrate and the interlayer insulating film 4. The barrier metal 5 contains, for example, titanium nitride. The barrier metal 5 is formed by physical vapor deposition (PVD) or CVD.

Further, the emitter electrode 6 is formed on the barrier metal 5. The emitter electrode 6 contains, for example, an aluminum-silicon alloy (Al—Si based alloy). The emitter electrode 6 is formed by PVD such as sputtering or vapor deposition. As the emitter electrode 6, a nickel alloy (Ni alloy) may be formed on the aluminum-silicon alloy by electroless plating or electrolytic plating. The plating method makes it possible to easily form a thick metal film. In a case where the emitter electrode 6 becomes thick, a heat capacity thereof increases, and as a result heat resistance of the emitter electrode 6 improves. In a case where a nickel alloy is further formed on the aluminum-silicon alloy by a plating process, the plating process may be performed after processing on the second main surface side of the semiconductor substrate is performed.

FIG. 21 is a diagram illustrating a step of thinning the semiconductor substrate. The second main surface of the semiconductor substrate is ground to thin the semiconductor substrate to a predetermined thickness according to the design of the semiconductor device. The thickness of the semiconductor substrate after the grinding is, for example, 80 μm or more and 200 μm or less.

FIG. 22 is a diagram illustrating a step of forming the n type buffer layer 3 and the p type collector layer 16. The n type impurities for forming the n type buffer layer 3 are ion-implanted into a surface layer of the n⁻ type drift layer 1 from the second main surface side of the semiconductor substrate. As the n type impurities, for example, phosphorus may be injected or protons may be injected. Alternatively, for example, both phosphorus and protons may be injected.

Protons is injected to a deep position from the second main surface of the semiconductor substrate with relatively low acceleration energy. The depth to which protons are injected is relatively easily controlled by changing the acceleration energy. Accordingly, in a case where protons are ion-implanted a plurality of times while changing the acceleration energy, an n type buffer layer 3 having a wider width in the thickness direction of the semiconductor substrate than an n type buffer layer 3 containing phosphorus is formed.

Phosphorus has a higher activation rate as n type impurities than protons. Even in the thinned semiconductor substrate, the n type buffer layer 3 containing phosphorus reduces occurrence of punch-through due to expansion of a depletion layer with more certainty. In order to further thin the semiconductor substrate, it is preferable to form an n type buffer layer 3 containing both protons and phosphorus. In this case, protons are injected to a deeper position than phosphorus from the second main surface of the semiconductor substrate.

Further, the p type impurities for forming the p type collector layer 16 are ion-implanted from the second main surface side of the semiconductor substrate. For example, boron is injected as the p type impurities. After the ion implantation, the second main surface of the semiconductor substrate is irradiated with a laser. The laser annealing activates the injected boron, thereby forming the p type collector layer 16.

During this laser annealing, phosphorus in the n type buffer layer 3 injected at a relatively shallow position from the second main surface of the semiconductor substrate is also activated. On the other hand, protons are activated at a relatively low annealing temperature of about 380° C. to 420° C. Therefore, it is preferable that after the injection of the protons, the semiconductor substrate is not heated to a temperature higher than 380° C. to 420° C. except for the step of activating the protons. The laser annealing heats only a vicinity of the second main surface of the semiconductor substrate to a high temperature. Therefore, laser annealing is effective for activating the n type impurities or the p type impurities after the injection of the protons.

The n type buffer layer 3 may be formed in the IGBT region 10, the diode region 20, and the terminal region 30 or may be formed only in the IGBT region 10 or the diode region 20. The p type collector layer 16 is also formed in the terminal region 30. The p type collector layer 16 in the terminal region 30 corresponds to the p type terminal collector layer 16a.

FIG. 23 is a diagram illustrating a step of forming the n⁺ type cathode layer 26. The n type impurities for forming the n⁺ type cathode layer 26 are ion-implanted into the second main surface of the semiconductor substrate in the diode region 20. Phosphorus is injected as the n type impurities. The n type impurities are selectively injected by a masking process so that a boundary between the p type collector layer 16 and the n⁺ type cathode layer 26 is located at the distance U1 from the boundary between the IGBT region 10 and the diode region 20 toward the diode region 20.

An injection amount of the n type impurities for forming the n⁺ type cathode layer 26 is larger than an injection amount of the p type impurities contained in the p type collector layer 16. The n type impurities for the n⁺ type cathode layer 26 are injected into a region where the p type collector layer 16 is formed. That is, it is necessary to change the p type semiconductor to an n type semiconductor by injecting the n type impurities. Therefore, the n type impurities are injected so that the concentration of the n type impurities becomes higher than the concentration of the p type impurities in all regions where the n⁺ type cathode layer 26 is to be formed.

Although an example in which the depth of the p type collector layer 16 and the depth of the n⁺ type cathode layer 26 from the second main surface are the same is illustrated in FIG. 23, a depth relationship between the p type collector layer 16 and the n⁺ type cathode layer 26 is not limited to this. The depth of the n⁺ type cathode layer 26 is equal to or greater than the depth of the p type collector layer 16.

Figure 24:
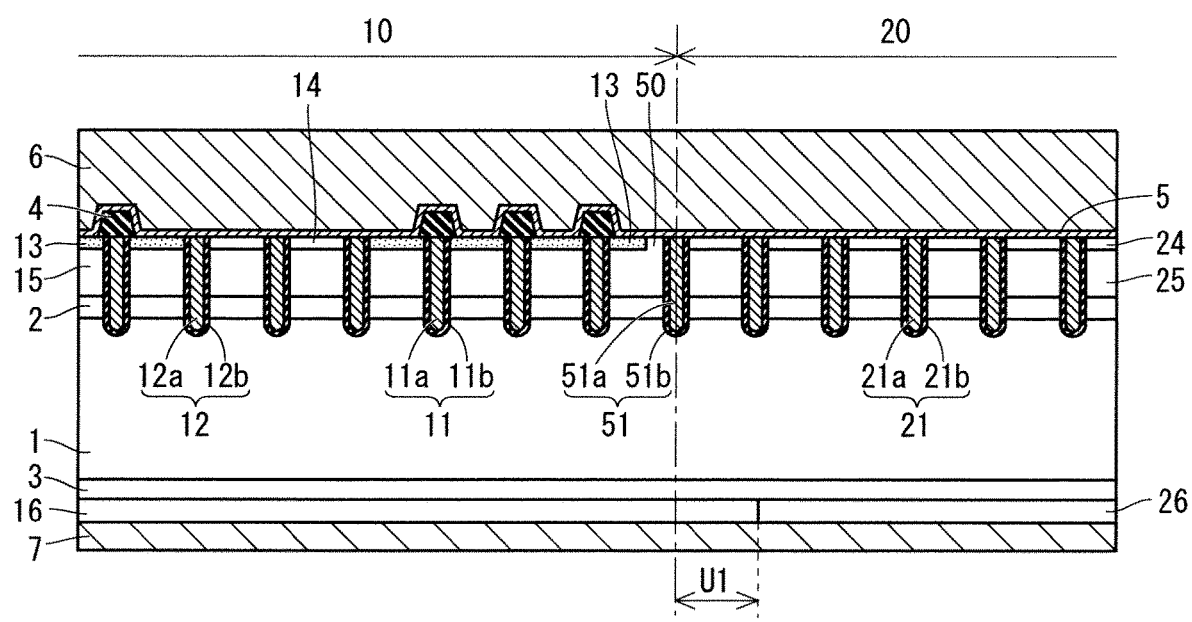
FIG. 24 is a diagram illustrating a step of forming a collector electrode.

FIG. 24 is a diagram illustrating a step of forming the collector electrode 7. The collector electrode 7 is formed on the second main surface in the IGBT region 10, the diode region 20, and the terminal region 30. The collector electrode 7 may be formed over the entire second main surface of the semiconductor substrate.

The collector electrode 7 contains an aluminum-silicon alloy, titanium, and the like. The collector electrode 7 is formed by PVD such as sputtering or vapor deposition. The collector electrode 7 may have a configuration in which a plurality of metal layers made of a metal such as an aluminum-silicon alloy, titanium, nickel, or gold are laminated. Further, another metal film may be formed as the collector electrode 7 by electroless plating or electroplating on a metal film formed by PVD.

In the first preferred embodiment, a plurality of semiconductor devices 100 or a plurality of semiconductor devices 101 are manufactured in a matrix on a single wafer by the above manufacturing steps. The plurality of semiconductor devices are separated into individual semiconductor devices by laser dicing or blade dicing. As a result, the semiconductor device 100 or the semiconductor device 101 is completed.

(Effects)

In summary, the semiconductor device according to the first preferred embodiment includes the semiconductor substrate, the IGBT region 10, the diode region 20, the boundary trench gate 51, and the carrier control region 50. A transistor is formed in the IGBT region 10. The transistor includes the p type base layer 15 (the first conductivity type base layer), the n⁺ type source layer 13 (the second conductivity type source layer), and the active trench gate 11. The p type base layer 15 is provided in the surface layer of the semiconductor substrate. The n+ type source layer 13 is selectively provided in the surface layer of the p type base layer 15. The active trench gate 11 extends so as to cross the n+ type source layer 13 in plan view. A diode is formed in the diode region 20. The diode region 20 is disposed adjacent to the IGBT region 10. The boundary trench gate 51 is provided in the boundary portion between the IGBT region 10 and the diode region 20. The carrier control region 50 is provided as a surface layer of the semiconductor substrate at a position closer to the boundary trench gate 51 than the n+ type source layer 13 located between the boundary trench gate 51 and the active trench gate 11. The concentration of the n type impurities (the concentration of the second conductivity type impurities) contained in the carrier control region 50 is lower than the concentration of the n type impurities contained in the n+ type source layer 13. The carrier control region 50 in the first preferred embodiment is the p type base layer 15 provided between the n+ type source layer 13 and the boundary trench gate 51.

The n+ type source layer 13 located between the boundary trench gate 51 and the active trench gate 11 is in contact with the active trench gate 11 and is not in contact with the boundary trench gate 51.

The semiconductor device 100 and the semiconductor device 101 configured as above reduce element destruction caused by a current concentrated in the boundary portion between the IGBT region 10 and the diode region 20.

When the IGBT or freewheeling diode is switched from on to off, a Hall current flows from the diode region 20 to the IGBT region 10. Therefore, holes are concentrated on the IGBT region 10 side of the boundary trench gate 51. In particular, a region along the boundary trench gate 51 corresponds to the shortest path for the holes to move. Therefore, a large current is more likely to flow in the region along the boundary trench gate 51 than in other locations. The Hall current flowing into the IGBT region 10 flows through the p+ type contact layer 14 having low resistance. In a conventional structure in which the n+ type source layer 13 is in contact with the boundary trench gate 51, the Hall current reaches the p+ type contact layer 14 while passing directly below the n+ type source layer 13. When the current increases, latch-up of a parasitic pn junction constituted by the n+ type source layer 13 and the p type base layer 15 occurs, thereby causing element destruction.

The semiconductor device 100 and the semiconductor device 101 according to the first preferred embodiment include the carrier control region 50 described above between the n+ type source layer 13 and the boundary trench gate 51. The Hall current flowing into the IGBT region 10 reaches the p+ type contact layer 14 via the carrier control region 50. Therefore, the Hall current is hard to flow below the n+ type source layer 13. Therefore, latch-up of the parasitic pn junction is unlikely to occur, thereby preventing element destruction.

Further, the n+ type source layer 13 is in contact with the active trench gate 11 of the IGBT region 10 that is adjacent to the boundary trench gate 51. Such a configuration enhances current-carrying capability of the semiconductor device 100 and the semiconductor device 101. The semiconductor device 100 and the semiconductor device 101 configured as above are useful as power semiconductor devices that controls a large amount of electric power.

In the first preferred embodiment, the first conductivity type corresponds to the p type, and the second conductivity type corresponds to the n type. However, the first conductivity type may correspond to the n type, and the second conductivity type may correspond to the p type. That is, the p type and n type of the layers of the semiconductor device 100 or the semiconductor device 101 may be interchanged with each other.

(Modification 1 of First Preferred Embodiment)

The carrier control region 50 is not limited to the p type base layer 15 between the n+ type source layer 13 and the boundary trench gate 51. The carrier control region 50 may include, for example, any one of an n− type semiconductor layer, a p− type semiconductor layer, and a p+ type semiconductor layer provided as a surface layer of the semiconductor substrate at a position closer to the boundary trench gate 51 than the n+ type source layer 13. An interface between the n+ type source layer 13 and the carrier control region 50 need not be clear. That is, it is only necessary that the concentration of the n type impurities contained in the carrier control region 50 be lower than the concentration of the n type impurities contained in the n+ type source layer 13. For example, the carrier control region 50 may include an n+ type semiconductor layer, a p− type semiconductor layer, or a p+ type semiconductor layer whose concentration of the n type impurities gradually decreases from the n+ type source layer 13 toward the boundary trench gate 51.

(Modification 2 of First Preferred Embodiment)

The boundary trench gate 51 is not in contact with the n+ type source layer 13 between the boundary trench gate 51 and the active trench gate 11. Therefore, the boundary trench gate 51 does not constitute an IGBT cell.

The boundary trench gate 51 may be a diode trench gate closest to the IGBT region 10 among the diode trench gates 21 provided in the diode region 20. In this case, the boundary portion where the boundary trench gate 51 is provided corresponds to an end of the diode region 20 that is adjacent to the IGBT region 10.

Second Preferred Embodiment

A semiconductor device according to the second preferred embodiment will be described below. The second preferred embodiment is a subordinate concept of the first preferred embodiment. In the second preferred embodiment, constituent elements similar to those in the first preferred embodiment are given identical reference signs, and detailed description thereof will be omitted.

FIG. 25 is a plan view illustrating a configuration of a boundary portion between an IGBT region 10 and a diode region 20 in the second preferred embodiment.

The semiconductor device according to the second preferred embodiment includes an n+ type source layer 13 and a p+ type contact layer 14 between a boundary trench gate 51 and an active trench gate 11. The n+ type source layer 13 and the p+ type contact layer 14 are formed in a surface layer of the p type base layer 15. In a region between the boundary trench gate 51 and the active trench gate 11, the n+ type source layer 13 and the p+ type contact layer 14 are alternately arranged in an extension direction of the active trench gate 11. That is, the p+ type contact layer 14 is disposed on both sides of the n+ type source layer 13.

A carrier control region 50 is a p type base layer 15 as in the first preferred embodiment. The p type base layer 15 is provided closer to the boundary trench gate 51 than the n+ type source layer 13.

With such a configuration, resistance of a path through which a Hall current flows is reduced. As a result, occurrence of latch-up is further prevented.

Third Preferred Embodiment

A semiconductor device according to the third preferred embodiment will be described below. The third preferred embodiment is a subordinate concept of the first preferred embodiment. In the third embodiment, constituent elements similar to those in the first or second preferred embodiment are given identical reference signs, and detailed description thereof will be omitted.

Figure 26:
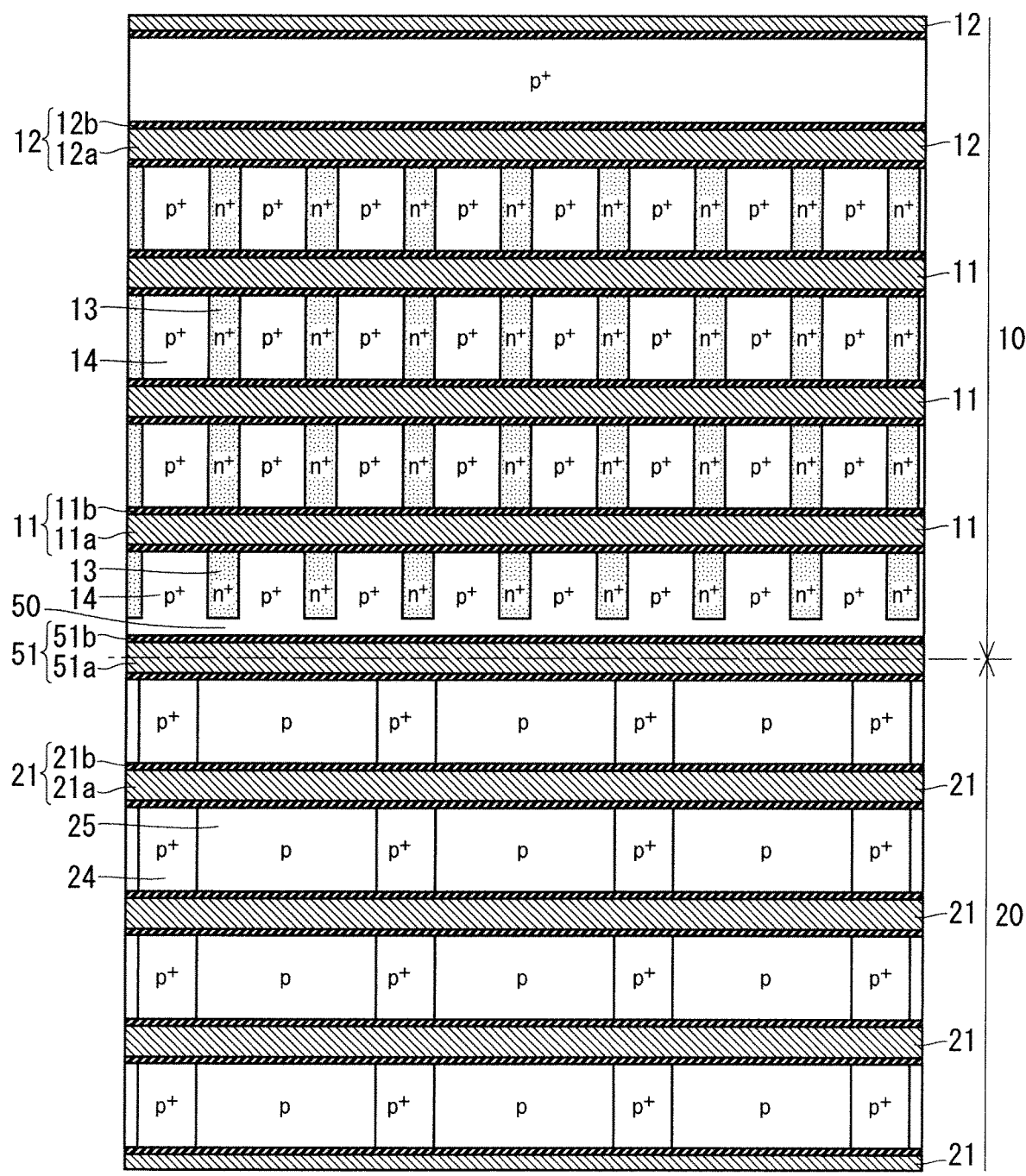
FIG. 26 is a plan view illustrating a configuration of a boundary portion between an IGBT region and a diode region in the third preferred embodiment.

FIG. 26 is a plan view illustrating a configuration of a boundary portion between an IGBT region 10 and a diode region 20 in the third preferred embodiment.

As in the second preferred embodiment, in a region between a boundary trench gate 51 and an active trench gate 11, an $n^+$ type source layer 13 and a $p^+$ type contact layer 14 are alternately arranged in a direction in which the active trench gate 11 extends.

A carrier control region 50 in the third preferred embodiment includes a $p^+$ type contact layer 14 located between the $n^+$ type source layer 13 and the boundary trench gate 51. The $p^+$ type contact layer 14 is formed in a surface layer of a p type base layer 15. In the region between the boundary trench gate 51 and the active trench gate 11, surfaces of the $n^+$ type source layer 13 and the $p^+$ type contact layer 14 constitute the first main surface of the semiconductor substrate.

The $n^+$ type source layer 13 located between the boundary trench gate 51 and the active trench gate 11 is formed by injecting n type impurities into the surface layer of the p type base layer 15. Further, the $p^+$ type contact layer 14 as the carrier control region 50 is formed by injecting p type impurities into the surface layer of the p type base layer 15. Accordingly, a concentration of the n type impurities contained in the $p^+$ type contact layer 14 as the carrier control region 50 is lower than a concentration of the n type impurities contained in the $n^+$ type source layer 13. Furthermore, a concentration of the p type impurities contained in the $p^+$ type contact layer 14 is higher than a concentration of the p type impurities contained in the $n^+$ type source layer 13.

With such a configuration, resistance between the $n^+$ type source layer 13 and the boundary trench gate 51 decreases. That is, the $p^+$ type contact layer 14 reduces resistance of a current path and suppresses a Hall current flowing below the $n^+$ type source layer 13 from the diode region 20.

(Modification of Third Preferred Embodiment)

In a modification of the third preferred embodiment, the $p^+$ type contact layer 14 as the carrier control region 50 is formed to a deeper position than the $n^+$ type source layer 13. In this case, the $p^+$ type contact layer 14 is formed so as to cover an end of a lower part of the $n^+$ type source layer 13. Therefore, resistance of a current path between the $n^+$ type source layer 13 and the boundary trench gate 51 further decreases.

Fourth Preferred Embodiment

A semiconductor device according to the fourth preferred embodiment will be described below. The fourth preferred embodiment is a subordinate concept of the first preferred embodiment. In the fourth embodiment, constituent elements similar to those in any of the first to third preferred embodiments are given identical reference signs, and detailed description thereof will be omitted.

Figure 27:
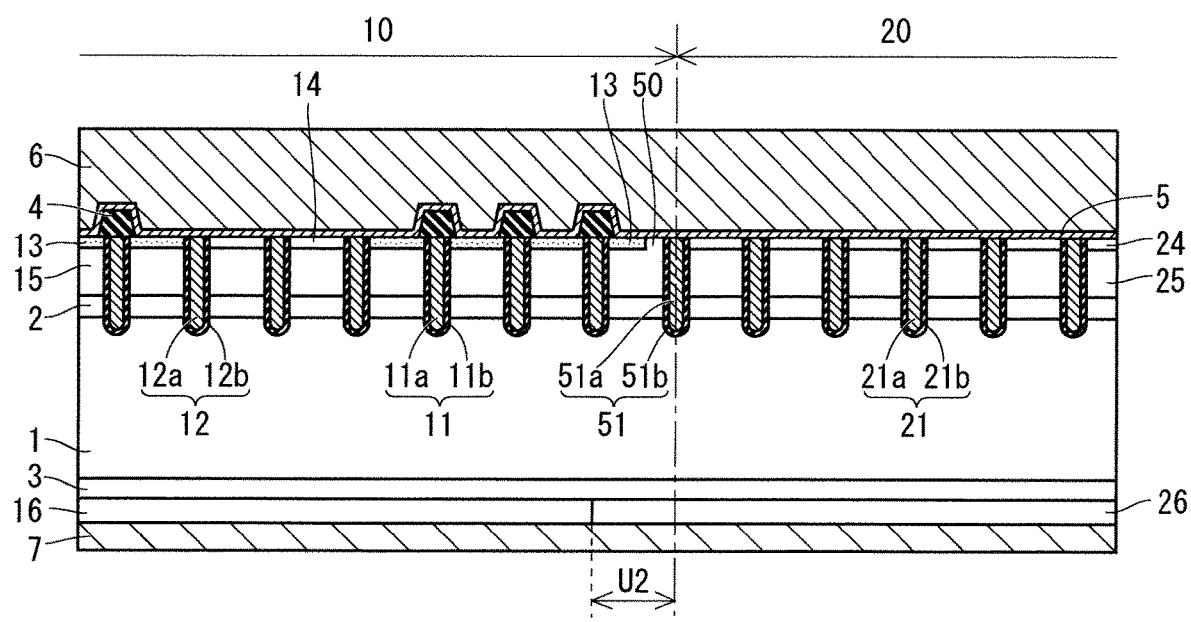
FIG. 27 is a cross-sectional view illustrating a configuration of a boundary portion between an IGBT region and a diode region in the fourth preferred embodiment.

FIG. 27 is a cross-sectional view illustrating a configuration of a boundary portion between an IGBT region 10 and a diode region 20 in the fourth preferred embodiment.

An $n^+$ type cathode layer 26 provided on a second main surface side of the diode region 20 is provided so as to protrude into the IGBT region 10 by a distance U2 from a boundary between the IGBT region 10 and the diode region 20. Compared with a structure in which the $n^+$ type cathode layer 26 does not protrude into the IGBT region 10, hole carriers injected into an $n^-$ type drift layer 1 during operation of the IGBT are reduced. A Hall current flowing into an end of the IGBT region 10 that is adjacent to a boundary trench gate 51 when the IGBT switches from on to off is also reduced. Therefore, destruction of the semiconductor device is prevented.

The embodiments of the present disclosure can be freely combined, and a modification and an omission can be made as appropriate to the embodiments.

While the disclosure has been shown and described in detail, the foregoing description is in all aspects illustrative and not restrictive. It is therefore understood that numerous modifications and variations can be devised.

What is claimed is:

1. A semiconductor device comprising:
   a semiconductor substrate;
   a transistor region in which a transistor is formed, the transistor including a first conductivity type base layer provided in a surface layer of the semiconductor substrate, a second conductivity type source layer selectively provided in a surface layer of the base layer, and a trench gate that extends so as to cross the source layer in plan view;
   a diode region that is disposed adjacent to the transistor region and in which a diode is formed;
   a boundary trench gate provided in a boundary portion between the transistor region and the diode region; and
   a carrier control region provided as the surface layer of the semiconductor substrate at a position closer to the boundary trench gate than the source layer located between the boundary trench gate and the trench gate, wherein
   a concentration of first conductivity type impurities contained in the carrier control region is higher than a concentration of the first conductivity type impurities contained in the source layer or a concentration of second conductivity type impurities contained in the carrier control region is lower than a concentration of the second conductivity type impurities contained in the source layer.

2. The semiconductor device according to claim 1, wherein
   the source layer located between the boundary trench gate and the trench gate is in contact with the trench gate and is not in contact with the boundary trench gate.

3. The semiconductor device according to claim 1, wherein
   the carrier control region includes the base layer provided between the source layer and the boundary trench gate.

4. The semiconductor device according to claim 1, wherein
   the transistor region includes a first conductivity type contact layer formed in the surface layer of the base layer as the surface layer of the semiconductor substrate between the boundary trench gate and the trench gate,
   the source layer and the contact layer provided between the boundary trench gate and the trench gate are alternately arranged in an extension direction of the trench gate, and a concentration of the first conductivity type impurities contained in the contact layer is higher than a concentration of the first conductivity type impurities contained in the base layer.

5. The semiconductor device according to claim 1, wherein the carrier control region includes a first conductivity type contact layer formed in a surface layer of the base layer provided between the source layer and the boundary trench gate, and a concentration of the first conductivity type impurities contained in the contact layer is higher than a concentration of the first conductivity type impurities contained in the base layer.

6. The semiconductor device according to claim 5, wherein the contact layer is formed to a deeper position than the source layer.

7. The semiconductor device according to claim 1, wherein the diode region includes:

a first conductivity type anode layer provided in the surface layer on an upper surface side of the semiconductor substrate; and a second conductivity type cathode layer provided in a surface layer on a lower surface side of the semiconductor substrate, and the cathode layer extends to the transistor region.

8. The semiconductor device according to claim 1, wherein the transistor region includes:

the base layer and the source layer provided in the surface layer on an upper surface side of the semiconductor substrate;

a first conductivity type collector layer provided in a surface layer on a lower surface side of the semiconductor substrate; and a second conductivity type drift layer between the base layer and the collector layer, the trench gate penetrates the source layer and the base layer from the upper surface of the semiconductor substrate and reaches the drift layer, the transistor is an insulated gate bipolar transistor (IGBT) including the source layer, the base layer, the drift layer, the trench gate, and the collector layer, the diode region includes:

a first conductivity type anode layer provided in the surface layer on the upper surface side of the semiconductor substrate;

a second conductivity type cathode layer provided in the surface layer on the lower surface side of the semiconductor substrate; and the drift layer between the anode layer and the cathode layer, the diode is a freewheeling diode including the anode layer, the cathode layer, and the drift layer, and the insulated gate bipolar transistor and the freewheeling diode provided on the semiconductor substrate form a reverse conducting IGBT.

* * * * *